(12) United States Patent
Gotoh et al.

(10) Patent No.: US 8,117,627 B2
(45) Date of Patent: Feb. 14, 2012

(54) OPTICAL DISK UNIT WITH FOLDING CIRCUIT BOARD

(75) Inventors: Hideru Gotoh, Fukuoka (JP); Katsumi Ichinose, Fukuoka (JP)

(73) Assignee: Panasonic Corporation, Osaka (JP)

( * ) Notice: Subject to any disclaimer, the term of this patent is extended or adjusted under 35 U.S.C. 154(b) by 1436 days.

(21) Appl. No.: 11/586,643

(22) Filed: Oct. 26, 2006

(65) Prior Publication Data

US 2007/0101350 A1    May 3, 2007

(30) Foreign Application Priority Data

Oct. 28, 2005  (JP) .................................. 2005-314092
Mar. 27, 2006  (JP) .................................. 2006-086084

(51) Int. Cl.
G11B 17/03   (2006.01)
G11B 17/04   (2006.01)
G11B 33/02   (2006.01)
G11B 33/12   (2006.01)

(52) U.S. Cl. ........................................ 720/601; 720/652
(58) Field of Classification Search .................. 720/601, 720/651–653, 685
See application file for complete search history.

(56) References Cited

U.S. PATENT DOCUMENTS

| | | | |
|---|---|---|---|
| 5,808,996 A * | 9/1998 | Aoyama | 720/651 |
| 6,151,284 A * | 11/2000 | Watanabe et al. | 720/601 |
| 6,320,835 B1 * | 11/2001 | Kamei | 720/653 |
| 6,910,218 B2 | 6/2005 | Park et al. | |
| 7,185,346 B2 | 2/2007 | Watanabe | |
| 7,698,714 B2 | 4/2010 | Choi | |
| 2003/0202447 A1 * | 10/2003 | Watanabe et al. | 369/75.2 |
| 2005/0076346 A1 | 4/2005 | Matsumoto et al. | |
| 2005/0198654 A1 | 9/2005 | Muta et al. | |
| 2006/0080688 A1 | 4/2006 | Soeda et al. | |

FOREIGN PATENT DOCUMENTS

| | | |
|---|---|---|
| JP | 6-349245 | 12/1994 |
| JP | 2000-090656 | 3/2000 |
| JP | 2001307460 | 11/2001 |
| JP | 2003151199 | 5/2003 |
| JP | 2003-248997 | 9/2003 |
| JP | 2004-164839 | 6/2004 |
| JP | 2005129202 | 5/2005 |
| JP | 2005322349 | 11/2005 |

OTHER PUBLICATIONS

Japanese Office Action dated Apr. 16, 2010.

* cited by examiner

*Primary Examiner* — Craig A. Renner
*Assistant Examiner* — Gustavo Polo
(74) *Attorney, Agent, or Firm* — Dickinson Wright PLLC

(57) ABSTRACT

An optical disk unit includes a tray for supporting an optical disk thereon, a body for receiving the tray therein, a first board provided at the body, a second board provided at the tray, and a wiring board (flexible board) electrically connecting the first board and the second board together. The wiring board (flexible board) has a number N of bent portions, the wiring board being bent at the number N of the bent portions of the wiring board, such that the wiring board is superposed in (N+1) layers where N is an integer equal to or greater than 1, and an area of the (N+1)-layer superposed portion is changed according to an amount of drawing-out of the tray.

7 Claims, 26 Drawing Sheets

OPTICAL DISK UNIT WITH FOLDING CIRCUIT BOARD

BACKGROUND OF THE INVENTION

1. Field of the Invention

This invention relates to an optical disk unit for effecting the recording or the reproduction relative to an optical disk.

2. Related Art

In recent years, optical disk units have become more compact and thinner in design, and have increasingly been contained in personal computers (hereinafter referred to as "PC"). Furthermore, the optical disk units have increasingly been contained in small, thin type computers (notebook or lap-top type computers) which can be easily carried. One reason for this is that software used in these computers has been designed to have a large capacity and that inexpensive CR-ROMs (recording media) distributed from magazine media, etc., have extensively been used. Accordingly, at present, it is quite natural to mount a disk unit in the computer.

First, description will be made of the structure of an optical disk unit with an overall height of not larger than 12.7 mm used in notebook PCs and thin-type Desk-top PCs (including a display/body integral type). There are mainly two types which have heretofore been commonly used. One is a drawer type in which the user holds an optical disk in his hand, and sets the optical disk directly on a turntable (which is a constituent part of an optical pickup), and then pushes a tray (including the turntable) into a body of an optical disk unit with his hand, so that the reproduction and recording can be effected relative to the disk. The other type is a so-called slot loading type in which an optical disk is brought to the front side of an optical disk unit, and is inserted into a slit formed in a cover (called a front bezel) provided at the front side of the optical disk unit, and when the disk is inserted into a certain position within the unit, the disk is automatically drawn by a mechanism (including rollers, etc.,) into a position within the disk unit where the disk can be located on a turntable. The drawer type is overwhelmingly predominant in the market, and has occupied most market share.

In some of the drawer type systems, there has been used a U-shaped flexible board for electrically connecting a board (which connects the optical disk unit to the PC) to the tray (see, for example, JP-A-2005-129202 Publication).

JP-A-2001-307460 Publication, JP-A-2003-151199 Publication and JP-A-2005-322349 Publication are also related art of the invention.

At present, most of optical disk units, employed in notebook computers emphasizing the portability, have an overall height of 12.7 mm, and recently an optical disk unit with an overall height of 9.5 mm has been used in thin and lightweight notebook computers further emphasizing the portability. In the future, it is expected that notebook computers will become still thinner and more lightweight in design, and therefore it is thought that the optical disk units will also be required to have a still thinner and more lightweight design.

When thinking of the still thinner design, the thickness and shape natures (such as warp, side runout, etc.) of an optical disk are already determined by the standards of optical disks, and a space or region in which the rotating optical disk will not contact other constituent parts need to be secured as in the conventional systems. Namely, in order to form the whole of the optical disk unit into a thin design, a spindle motor, a pickup module and the body, disposed at the upper and lower sides of the optical disk-rotating region must be thinned.

The thin design and the lightweight design are thus required, and in the type of disk unit as disclosed in JP-A-2005-129202 Publication, a large area for mounting the flexible board has been required to be provided in the body.

SUMMARY OF THE INVENTION

According to the present invention, there is provided an optical disk unit comprising a tray for supporting an optical disk thereon, a body for receiving the tray therein, a first board provided at the body, a second board provided at the tray, and a wiring board electrically connecting the first board and the second board together; characterized in that the wiring board has a number N of bent portions, the wiring board being at the number N of the bent portions of said wiring board, such that the wiring board is superposed in (N+1) layers where N is an integer equal to or greater than 1; and an area of the (N+1)-layer superposed portion is changed according to an amount of drawing-out of the tray.

As described above, in the present invention, there can be achieved the optical disk unit in which the area for mounting the wiring board in the body is small.

DETAILED DESCRIPTION OF THE PREFERRED EMBODIMENTS

First Embodiment

Figure 1:
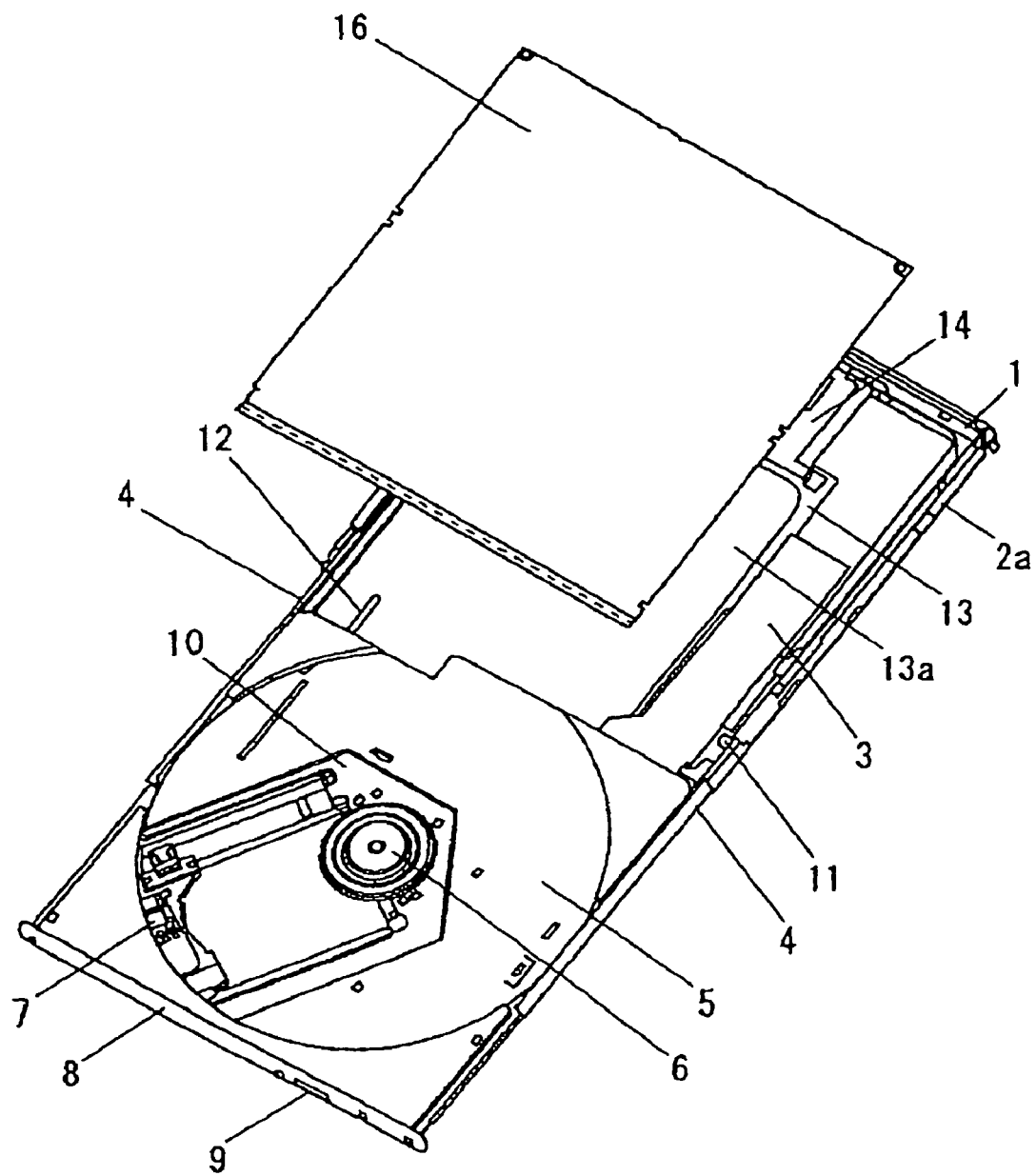
FIG. 1 is a view showing the whole of a first embodiment of an optical disk unit of the present invention.

A first embodiment of an optical disk unit of the present invention will now be described with reference to the drawings. In the optical disk unit of the first embodiment, a direction X indicates a direction in which a tray 5 is drawn out from a body, and a direction Z is a direction which is perpendicular to the direction X, and is parallel to a rotation shaft of a spindle motor 6, an optical axis of an objective lens (provided at an optical pickup 7) and a focusing direction of a moving part of the optical pickup 7. In other words, the direction Z is the direction in which light, going out of the objective lens, and then reflected by a disk attached to the spindle motor 6, is again incident on the objective lens. Namely, the direction Z is the direction in which the user attaches the disk on the spindle motor 6. A direction Y is perpendicular to the direction X and the direction Z. Directions opposite respectively to the directions X, Y and Z will be referred to as directions −X, −Y and −Z, respectively. A recording surface and a label surface of the disk, attached to the spindle motor 6, and main surfaces of bottom and top plates 13 and 16 of the body are generally parallel to a plane X-Y defined by the directions X and Y.

Figure 2:
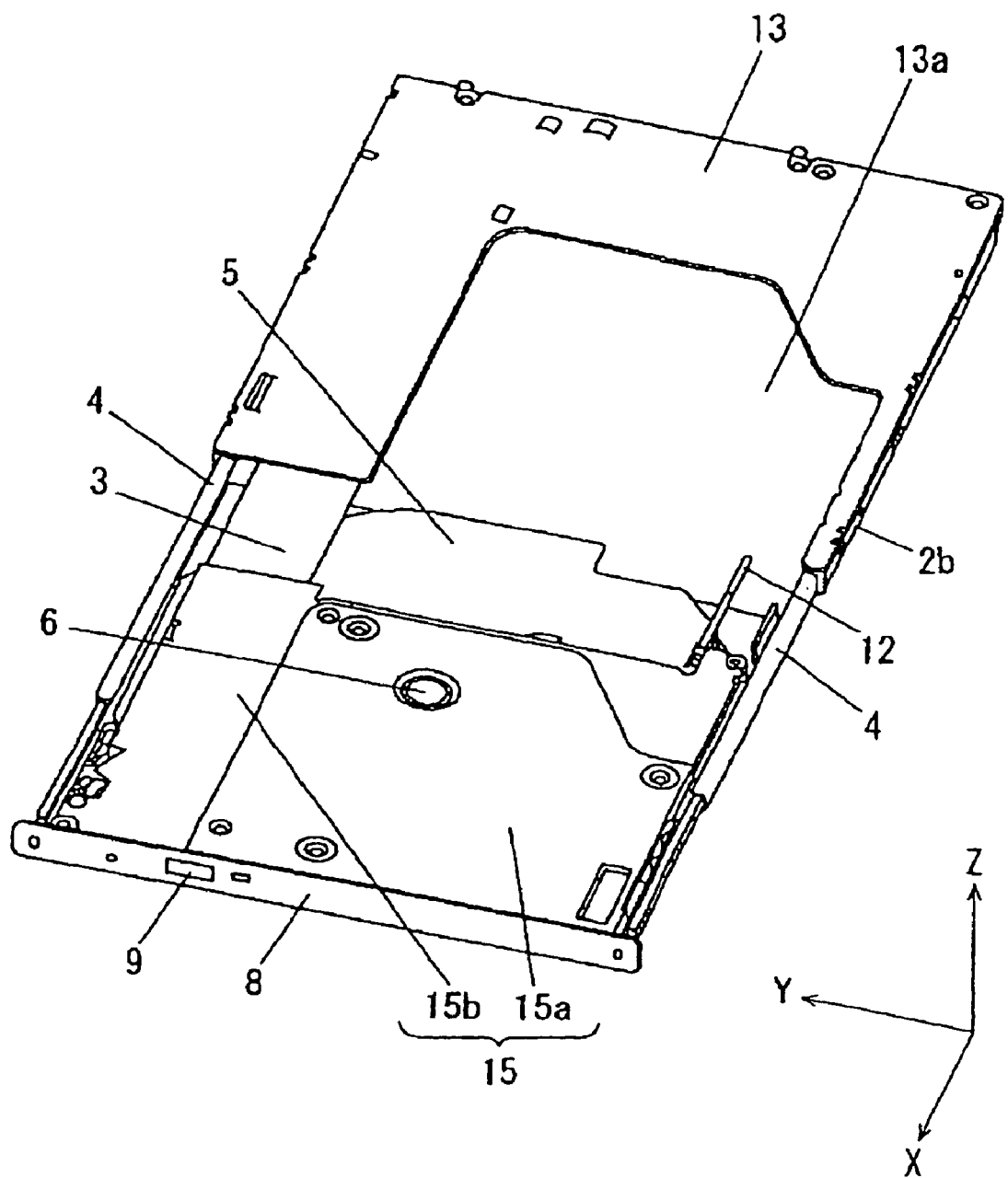
FIG. 2 is a reverse view of the optical disk unit of the first embodiment.
Figure 3:
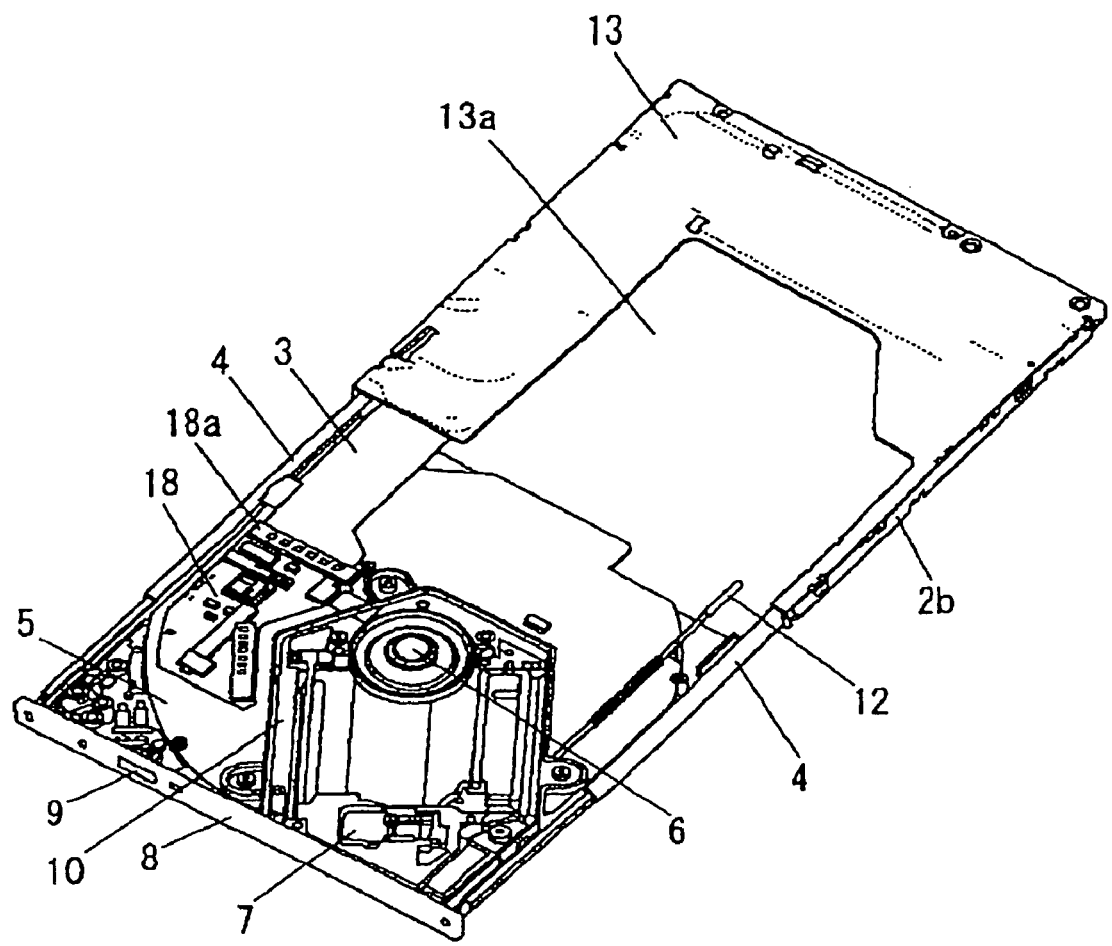
FIG. 3 is a view showing the optical disk unit of the first embodiment.
Figure 3:
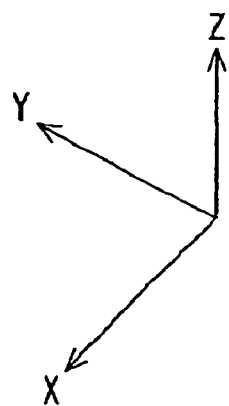
Figure 4:
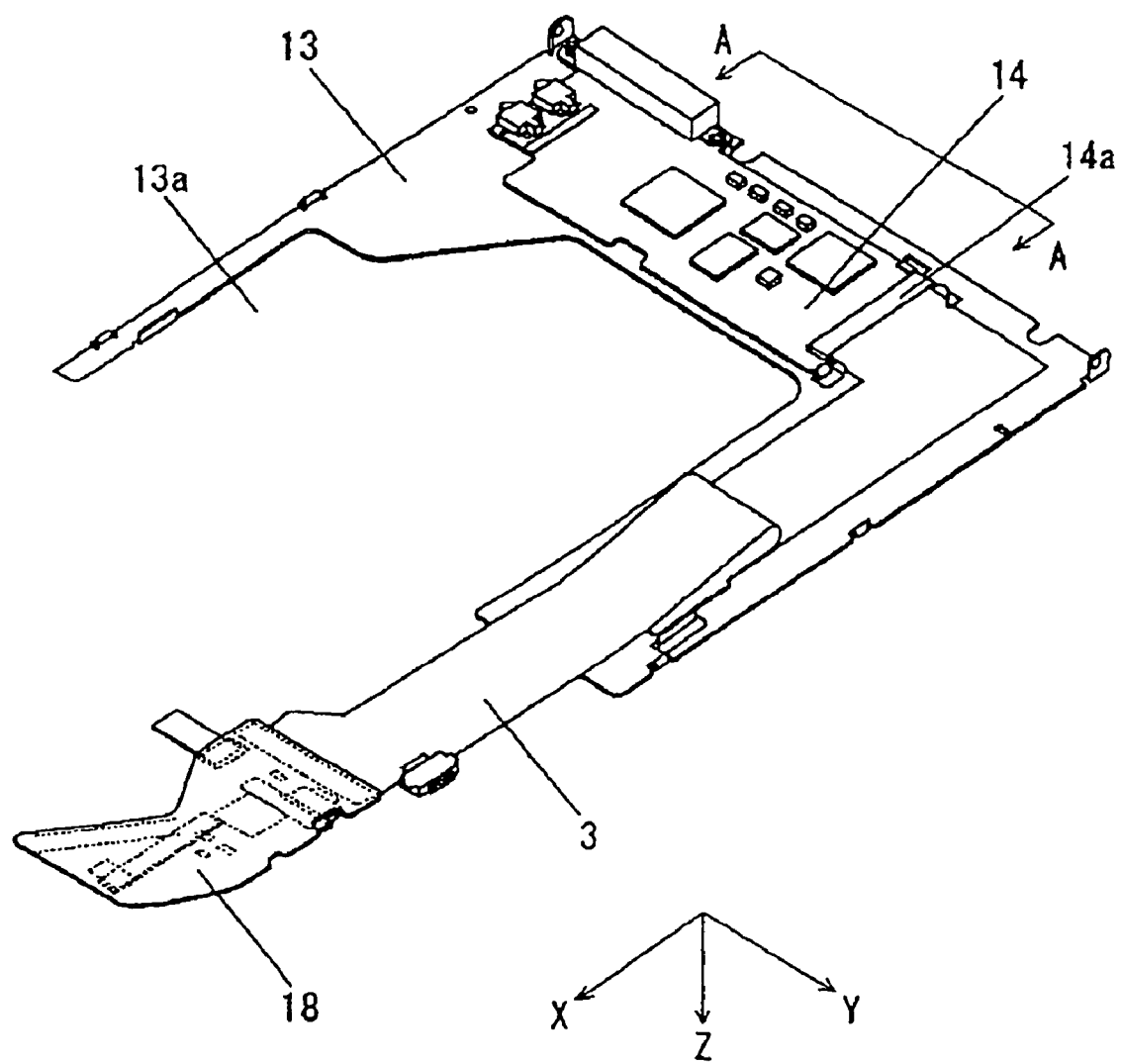
FIG. 4 is a view showing the optical disk unit of the first embodiment.
Figure 6A:
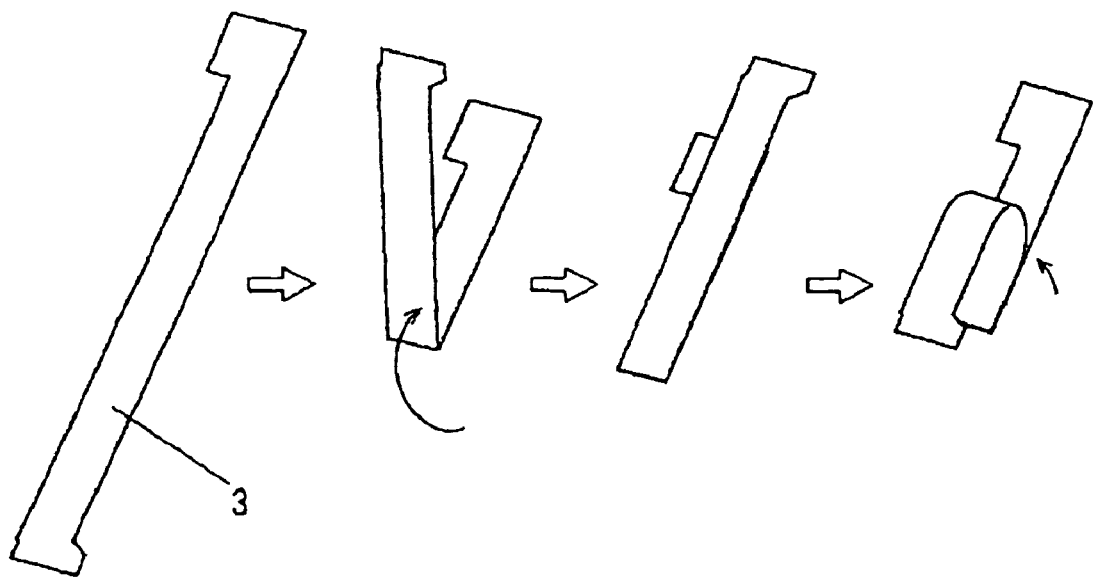
FIG. 6A is a view showing a method 2 of folding a flexible board of the first embodiment.
Figure 6B:
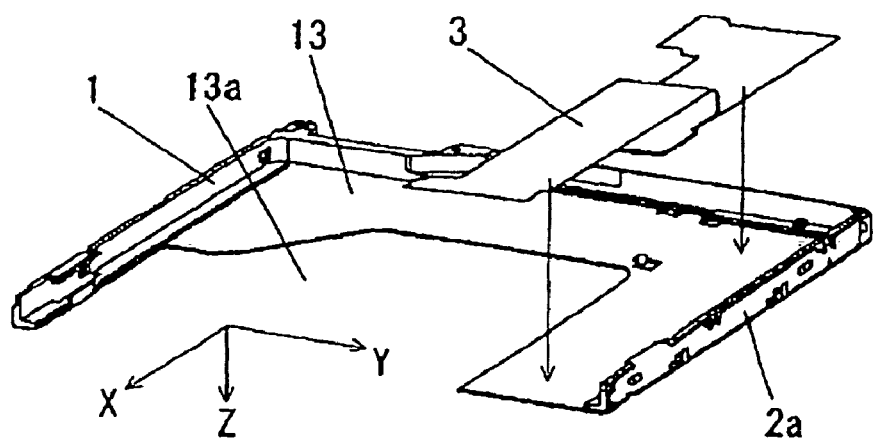
FIG. 6B is a view showing the mounting of the flexible board on the bottom plate.
Figure 7:
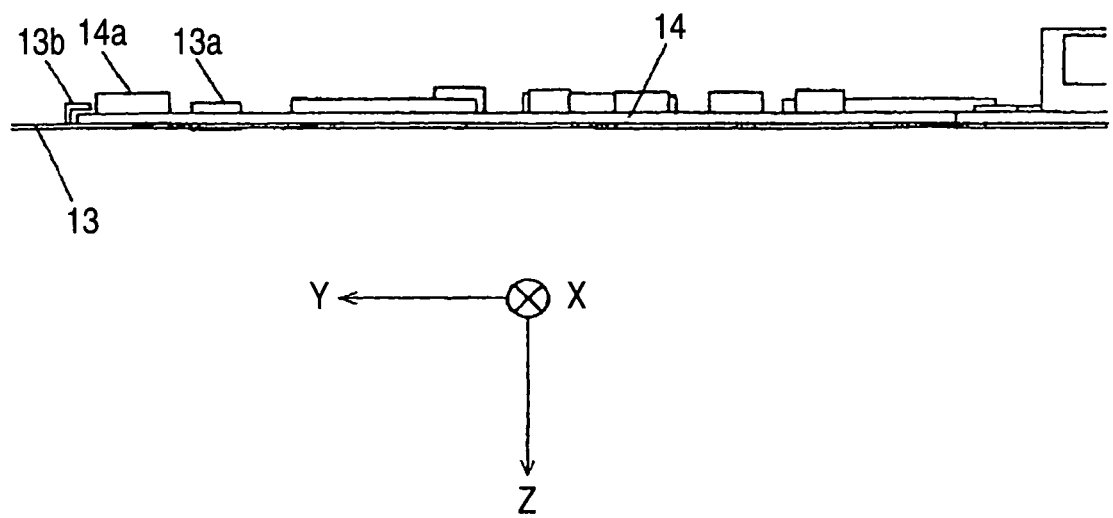
FIG. 7 is a view showing the disk unit of the first embodiment.
Figure 8:
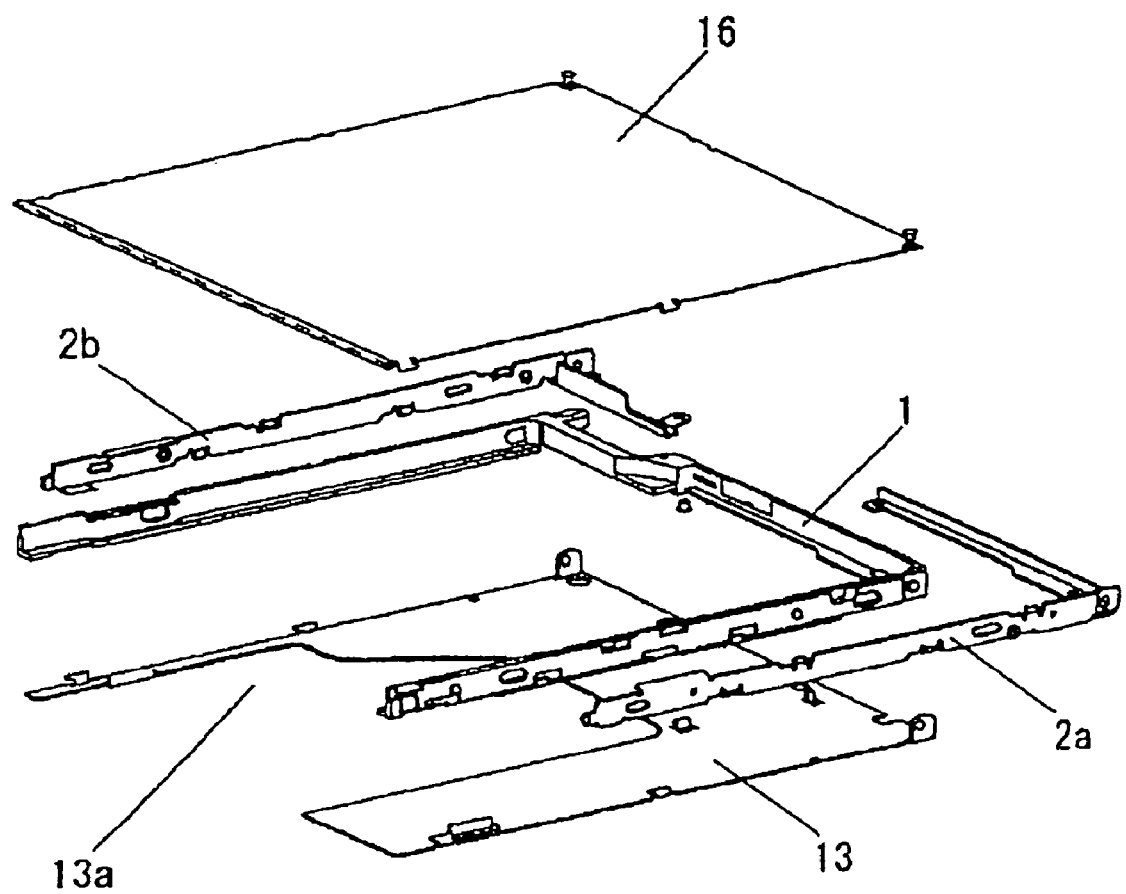
FIG. 8 is a view showing the disk unit of the first embodiment.
Figure 8:
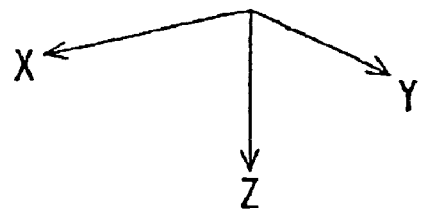

FIG. 1 is a perspective view showing the whole of the drawer-type optical disk unit. FIG. 2 is a reverse view of the optical disk unit of this embodiment. FIG. 3 is a reverse, perspective view of the optical disk unit of FIG. 2, with a tray cover 15 removed therefrom. FIG. 4 is a perspective view showing a condition in which a main board 14 and a flexible board 3 are mounted on the bottom plate 13, and the flexible board 3 is connected to an auxiliary board 18 (mounted on the tray 5) and the main board 14. FIGS. 5A through 6B are perspective views respectively showing methods of mounting the flexible board 3 on the bottom plate 13. FIG. 7 is a view as seen from the line A-A of FIG. 4. FIG. 8 is a perspective view showing the construction of the body.

As shown in FIGS. 1 and 8, reference numeral 1 denotes a frame of the body of the optical disk unit which is made of a synthetic resin or the like, and reference numeral 2a denotes a reinforcing plate reinforcing that side of the frame 1 facing in the direction Y, and reference numeral 2b denotes a reinforcing plate reinforcing that side of the frame 1 facing in the direction −Y. Screw holes are formed through the reinforcing plates 2a and 2b. The disk unit is mounted on an external equipment (such as a PC) through part of the external equipment by screws threaded into the respective screw.

As shown in FIGS. 1 to 6B, the flexible board 3 connects the main board 14 to the auxiliary board 18 mounted on the tray 5. Reference numeral 4 denotes rails interconnecting the frame 1 and the tray 5. The optical disk serving as a recording medium can be put on the tray 5, and the tray 5 is mounted in the body of the optical disk unit so as to move in the directions X and −X relative thereto. The tray 5 is mounted on the frame 1 through the rails 4, and the rails 4 and the tray 5, as well as the rails 14 and the frame 1, can slide relative to each other in the directions X and −X so that the user can withdraw the tray 5 when loading and unloading the disk. The frame 1 is made of a synthetic resin or the like, and therefore the sliding movement of the rails 4 relative to the frame 1 can be effected smoothly, and therefore the user can easily push the tray 5 into the body of the optical disk unit, and also can easily withdraw the tray 5 from the body.

The spindle motor 6 is mounted on the tray 5, and the optical disk is attached to the spindle motor 6 so as to be rotated. Reference numeral 7 denotes the optical pickup which irradiates light to the optical disk so as to read information recorded in the optical disk or to record information in the optical disk. Reference numeral 8 denotes a bezel which is provided at that end portion of the tray 5 facing in the direction X, and serves as a lid at a side surface of the body when the tray 5 is pushed into the body of the optical disk unit in the direction −X (that is, when the tray 5 is received in the body). When the optical disk unit is mounted within a notebook PC, the bezel 8 is, in some cases, exposed to a front surface of the PC to form part of a body of the PC.

Reference numeral 9 denotes an ejection button which the user pushes in the direction X when withdrawing the tray 5 from the body of the optical disk unit. When the ejection button 9 is pushed, a tray fixing mechanism (not shown) gives instructions to release a fixing pin 11.

Reference numeral 10 denotes a pickup module which includes the spindle motor 6, the optical pickup 7, etc., and conveys the optical pickup 7 in a radial direction of the optical disk attached to the spindle motor 6. In the pickup module 10, the optical pickup 7 is conveyed radially of the optical disk so that the optical disk unit can read information recorded in the whole of the optical disk, and can write information on the whole of the optical disk.

The fixing pin 11 of the tray fixing mechanism can engage part of the tray 5 to serve as a hook to retain the tray 5 within the frame 1. Reference numeral 12 denotes a tray discharge pin which pushes out the tray 5 in the direction X relative to the body when the optical disk is to be put on or to be removed from the tray 5. The bottom plate 13 forms that surface of the body facing in the direction Z, and protects a surface 15b of the tray cover 15 (mounted on that end of the tray 5 facing in the direction Z) and so on, and secures the strength of the frame 1. The main board 14 is mounted on the bottom plate 13. The bottom plate 13 is made of metal, and an opening 13a is formed by pressing or the like in a main surface of the bottom plate 13 disposed generally parallel to the plane X-Y, so that the bottom plate 13 has a generally U-shape.

As shown in FIG. 2, the tray cover 15 is mounted in the direction −Z on the tray 5 from the lower side thereof, and protects the pickup module 10, the auxiliary board 18, etc., mounted on the tray 5. The tray cover 15 is stepped to have several surfaces disposed generally parallel to the plane X-Y, and when the tray 5 is pushed into the body in the direction −X, the surface 15a which is most convex in the direction Z among these surfaces is received in a notch 13a formed in the bottom plate 13, and forms a surface of the generally rectangular parallelepiped body of the optical disk unit. The tray cover 15 also has the surface 15b which is recessed relative to the surface 15a as viewed in the direction Z, and when the tray 5 is pushed into the body in the direction −X, the surface 15b is covered by the bottom plate 13.

As shown in FIGS. 1 and 8, the top plate 16 is made of metal, and forms that surface (upper side) of the body facing in the direction −Z, and protects the upper portion of the optical disk unit, and secures the strength of the frame 1.

As shown in FIGS. 3 and 4, the auxiliary board 18 electrically connects the main board 14 to the pickup module 10. The main board 14 and the auxiliary board 18 are connected together by the flexible board 3 so as to effect the transmitting and receiving of electrical signals and the supply of electric power. The auxiliary board 18 and the optical pickup 7 are connected together by a flexible board (which is not shown to avoid the confusion with the flexible board 3) so as to effect the transmitting and receiving of electrical signals and the supply of electric power.

As shown in FIG. 4, the flexible board 3 is bonded to the surface of the bottom plate 13 facing in the direction −Z. One end of the flexible board 3 is connected to a terminal 14a of the main board 14 mounted on the bottom plate 13, and the other end thereof is connected to a terminal 18a of the auxiliary board 18 mounted on the tray 5, as shown in FIG. 3.

Figures 5A, 5B, 5C:
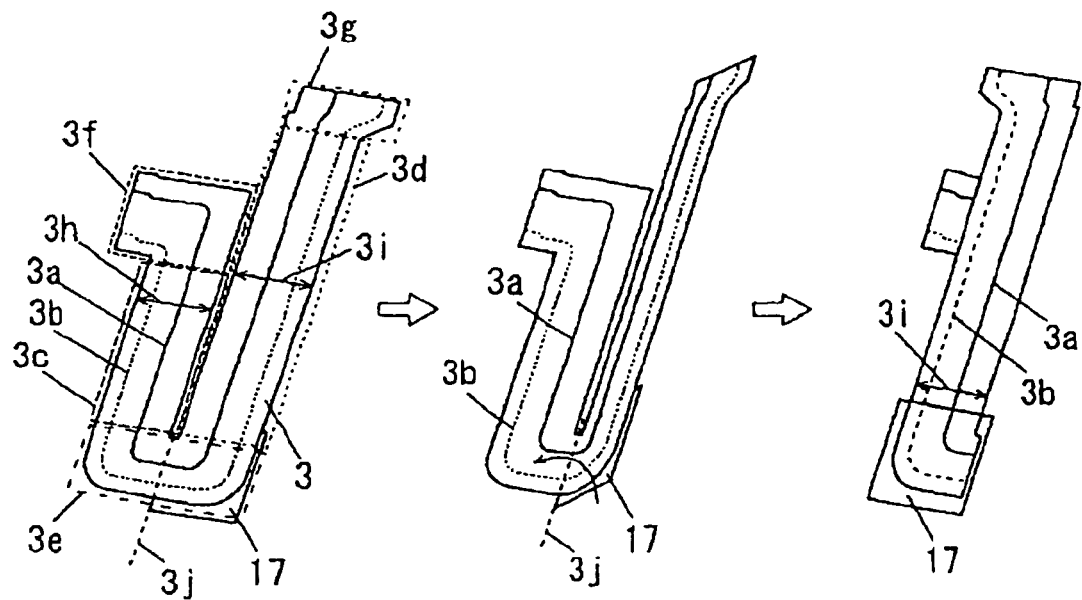
FIGS. 5A to 5C are views showing a method 1 of folding a flexible board of the first embodiment.

As shown in FIG. 5A, the flexible board 3 in its developed condition has a generally U- (or J-) shape, and includes two longitudinal portions 3c and 3d extending long and straight, a short portion 3e of a generally D-shape interconnecting the longitudinal portion 3c and the longitudinal portion 3d, an end portion 3f which is disposed adjacent to the longitudinal portion 3c so as to be connected to the terminal 14a of the main board 14, and an end portion 3g which is disposed adjacent to the longitudinal portion 3d so as to be connected to the terminal 18a of the auxiliary board 18. In FIGS. 5A through 5D, although a width 3h of the longitudinal portion 3c is generally equal to a width 3i of the longitudinal portion 3d, the two widths do not always need to be equal to each other. By reducing the widths 3h and 3i of the flexible board 3, the opening 13a can be widened in the direction Y, so that the area of the surface 15a of the tray 5 can be increased, and therefore the optical disk unit can be formed into a thin design.

Wires 3a and 3b in the flexible board 3 are formed into a shape generally corresponding to the outer shape of the flexible board 3. Here, although only the wire 3a (indicated in a solid line in FIGS. 5A through 5D) and the wire 3 (indicated by a broken line) are shown as the wires of the flexible board 3, actually several tens of wires are formed in the flexible board 3. Preferably, the wires, serving as power wires for supplying electric power to the auxiliary board 18, are thick since their resistance value is lower.

As shown in FIG. 5B, the flexible board 3 is folded on itself at and along a bending portion 3j. The bending portion 3j is disposed on and extends longitudinally along an extension line of a gap between the longitudinal portions 3c and 3d. When the flexible board 3 is folded on itself at the bending portion 3j, the longitudinal portion 3c and the longitudinal portion 3d are opposed to each other in a superposed (or stacked) condition as shown in FIG. 5C. By interposing a shielding member (such as a copper foil) between the superposed portions of the flexible board 3 in such a manner that this shielding member covers opposed portions of the longitudinal portion 3d and end portion 3f, opposed portions of the longitudinal portions 3d and 3c and opposed two sections of the short portion 3e folded along the bending portion 3j, the interference of electrical signals, flowing through the superposed portions of the flexible board 3, are less liable to occur.

Figure 5D:
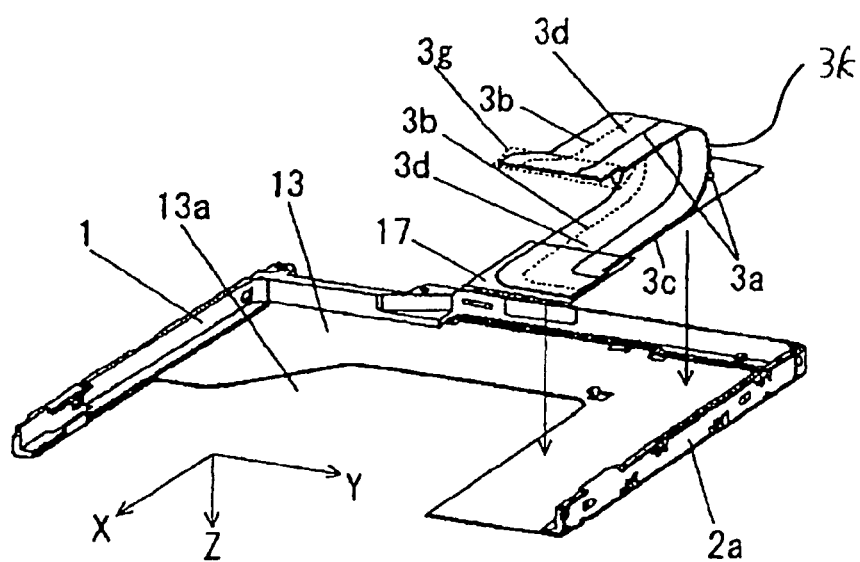
FIG. 5D is a view showing the mounting of the flexible board on a bottom plate.

As shown in FIG. 5A, an adhesive single coated tape 17, having an adhesive formed on one side thereof which is opposed to the short portion 3e, is bonded to a reverse surface of the short portion 3e. As shown in FIG. 5C, a width of the adhesive single coated tape 17 is larger than the width 3i, and is so sized as to cover part of the longitudinal portion 3d and the short portion 3e of the flexible board 3 folded at the bending portion 3j. Although not shown in the drawings, an adhesive double coated tape is bonded to a reverse surface of the longitudinal portion 3c, and the longitudinal portion 3c is bonded in the direction Z to the bottom plate 13 as shown in FIG. 5D. The short portion 3e and the longitudinal portion 3d are bonded in the direction Z to the bottom plate 13 by the adhesive single coated tape 17. The adhesive single coated tape 17 is bonded in the direction Z to the bottom plate 13 in such a manner that this adhesive tape 17 covers part of the bottom plate 13 and the flexible board 3 folded in two at the bending portion 3j and superposed on itself in the direction Z. The surface of the adhesive single coated tape 17 which is exposed in this condition is formed by a member having good slinging properties. Therefore, even if the tray 5, when pushed into the body in the direction −X, is disposed close to the bottom plate 13, the tray 5 smoothly slides over the adhesive single coated tape 17, and therefore will not interfere with the short portion (3e)-side end of the flexible board 3.

As shown in FIG. 5D, the longitudinal portion 3d is bent in the direction −Z. Then, the end portion 3g is pulled in the direction X, and is connected to the terminal 18a as shown in FIG. 3. Thus, the flexible board 3 has two bent portions, that is, the bent portion bent at the bending portion 3j and the bent portion at the bending portion 3k of the longitudinal portion 3d. At least part of the portion between the bending portion 3j and the longitudinal edge of the longitudinal portion 3d is adhesively bonded to the body by the adhesive single coated tape 17, and is fixed thereto. The flexible board 3, when drawn out most in the direction X, is superposed (or stacked) in three layers in the direction Z. In FIG. 1, the portion of the longitudinal portion 3d disposed adjacent to the end portion 3g, the portion of the longitudinal portion 3d disposed adjacent to the short portion 3e, and the portion of the longitudinal portion 3c disposed adjacent to the short portion 3e are superposed. At the direction X-side, the portion of the longitudinal portion 3d disposed adjacent to the end portion 3g, the portion of the short portion 3e disposed adjacent to the longitudinal portion 3d, and the portion of the short portion 3e disposed adjacent to the longitudinal portion 3c are superposed. With this arrangement, when inserting and withdrawing the tray 5, the flexible board 3 is slid and bent without a load resistance, and therefore the conveyance of the optical disk can be effected smoothly.

The flexible board 3 is not limited to the generally U- (or J-) shape as shown in FIGS. 5A through 5D, but can have any other suitable shape in so far as the flexible board 3, when bent or folded, can be superposed in layers to assume a generally linear shape (i.e., a generally I-shape). For example, the flexible board 3 can have a generally V-shape, a generally L-shape, a generally recumbent V-shape, or a generally linear shape (i.e., a generally I-shape) as shown in FIG. 6. In this case, also, when the flexible board 3 is folded as shown in FIG. 6A, and is bonded to the body of the optical disk unit as shown in FIG. 6B, the area, occupied by the flexible board 3 in the optical disk unit, is small when viewed in the direction Z, and therefore the portion of the bottom plate 13 on which the flexible board 3 is not bonded can be removed to provide the opening 13a. The pickup module 10 (which is particularly thick in the direction Z within the optical disk unit) is received in this opening 13a, and therefore the optical disk unit can be reduced in thickness in the direction Z.

In the optical disk unit, the main board 14 and the pickup module 10 can be positively electrically connected together by the use of the flexible board 3 which is the slidable, bendable electrical connection device. As described above, the flexible board 3 is folded to be superposed in the layers, and by doing so, the area of bonding of the flexible board 3 can be made small, and the opening 13a is formed in the bottom plate 13, so that the disk unit having the thickness of not larger than 9.5 mm in the direction Z can be provided.

As described above, the wiring board, electrically connecting the two boards together, has the two bent portions such that the wiring board is superposed (or stacked) in three layers, and the area of the 3-layer superposed portion is changed according to the amount of drawing-out of the tray. With this construction, the area of mounting of the wiring board can be made small while maintaining the operability of the tray when withdrawing and inserting the tray relative to the body. In the first embodiment, the wiring board is the flexible board 3. In the first embodiment, the wiring board, electrically connecting the two boards together, has the two bent portion such that the wiring board is superposed in the three layers, and the area of the 3-layer superposed portion is changed according to the amount of drawing-out of the tray. However, the number of the bent portions of the wiring board is not limited to two. When the wiring board has two or more bent portions, similar advantages as in the first embodiment can be obtained.

As shown in FIG. 7, the main board 14 is a single-sided board, and is fixed to the bottom plate 13 by claws 13b (formed on the bottom plate 13) engaging the main board 14 or by screws. The terminal 14a, integrated elements, etc., are mounted on a surface of the main board 14 facing in the direction −Z. A surface of the main board 14, facing in the direction Z and having no element mounted thereon, is held in contact with the bottom plate 13. By thus holding the main board 14 in contact with the bottom plate 13, the strength of the body can be increased, and besides heat generated from the integrated elements, etc., can be efficiently radiated through the bottom plate 13. The main board 14 is thus held in surface-to-surface contact with the bottom plate 13, and the strength of the main board 14 is added to the strength of the bottom plate 13, and by doing so, the strength of the bottom plate 13 can be increased, and therefore the bottom plate 13 itself can be reduced in thickness.

Figure 9:
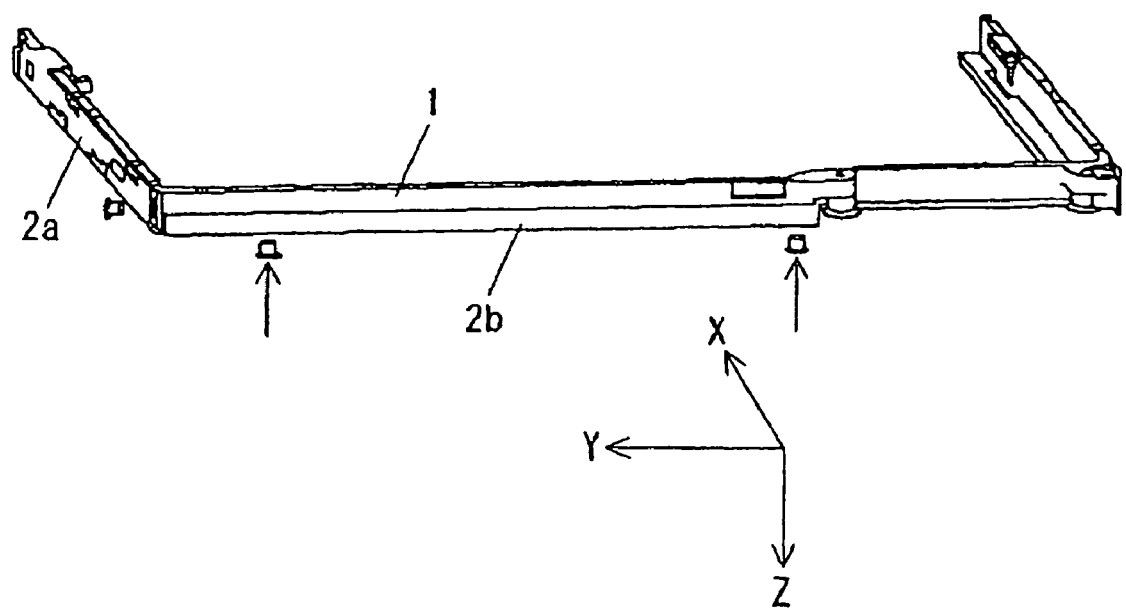
FIG. 9 is a view showing a frame and reinforcing plates which form a body of the first embodiment.

FIG. 9 is a perspective view showing the frame 1 and the reinforcing plates 2. The resin-made frame 1 comprises generally straight three members (forming three sides of the frame) combined together into a generally U-shape in a plane parallel to the plane X-Y. Those portions of the frame 1 on which the rails 4 are mounted, respectively, have a generally L-shaped cross-section in a plane generally parallel to a plane Y-Z.

Figure 10A:
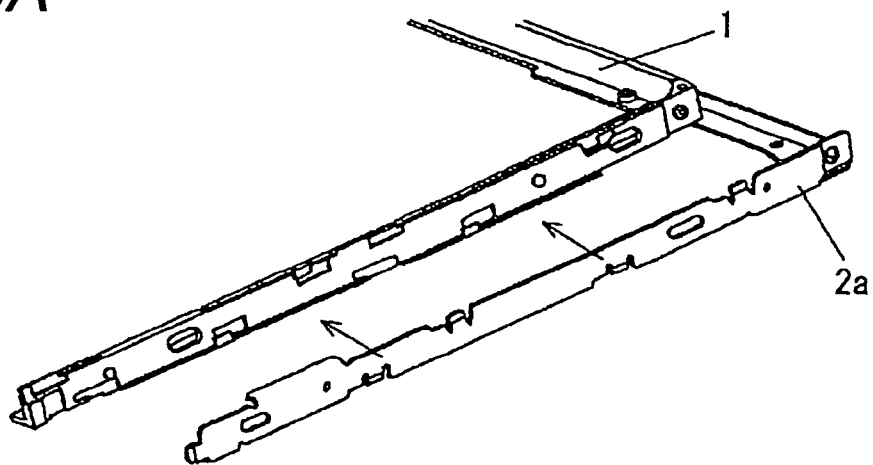
FIGS. 10A to 10C are views showing a method of assembling the frame and reinforcing plate of the box-like of the first embodiment.
Figure 10B:
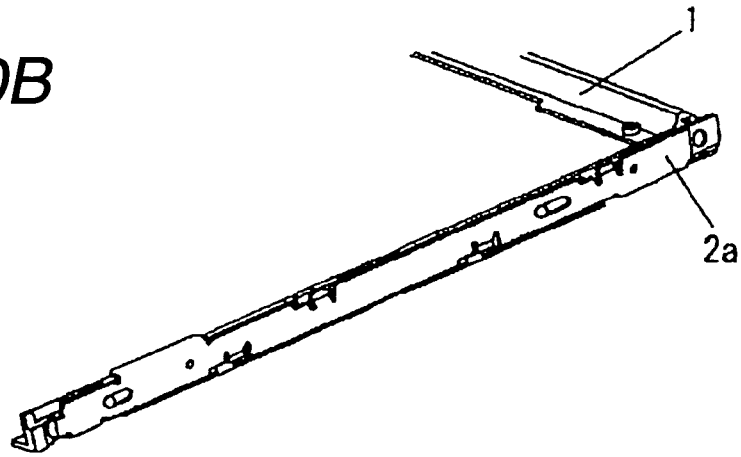
Figure 10C:
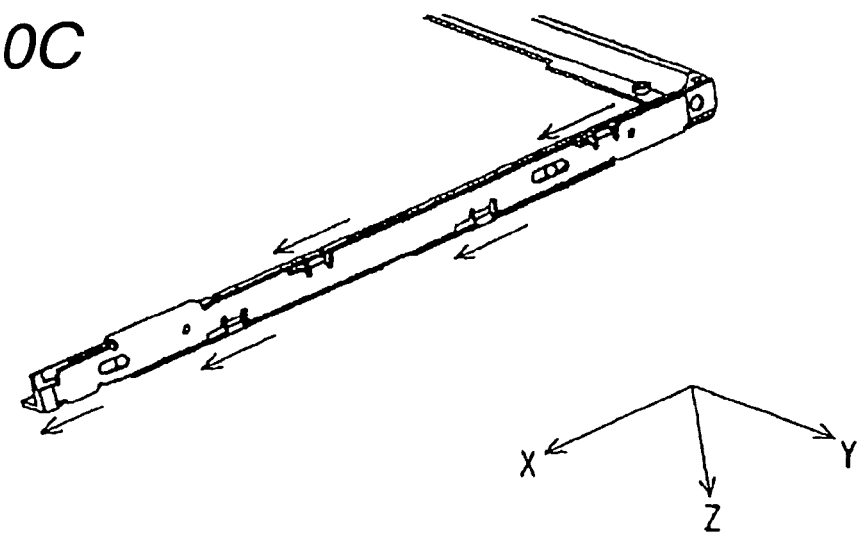

FIGS. 10A to 10C are views showing a method of combining the frame 1 and the reinforcing plate 2 together. As shown in FIGS. 10A to 10C, the reinforcing plate 2a made of metal is closely contacted with the frame 1 in conformity with a recess formed in the frame 1, and is slid in the direction X (which is the direction of drawing-out of the tray 5), and is fitted to a convex portion of the frame 1, and then is fixed to the frame 1 by screws. The opposite-side reinforcing plate 2b is fixed to the frame 1 in a similar manner. Screw holes for mounting the disk unit on the external equipment such as a personal computer are formed in the reinforcing plates 2a and 2b.

Figure 11:
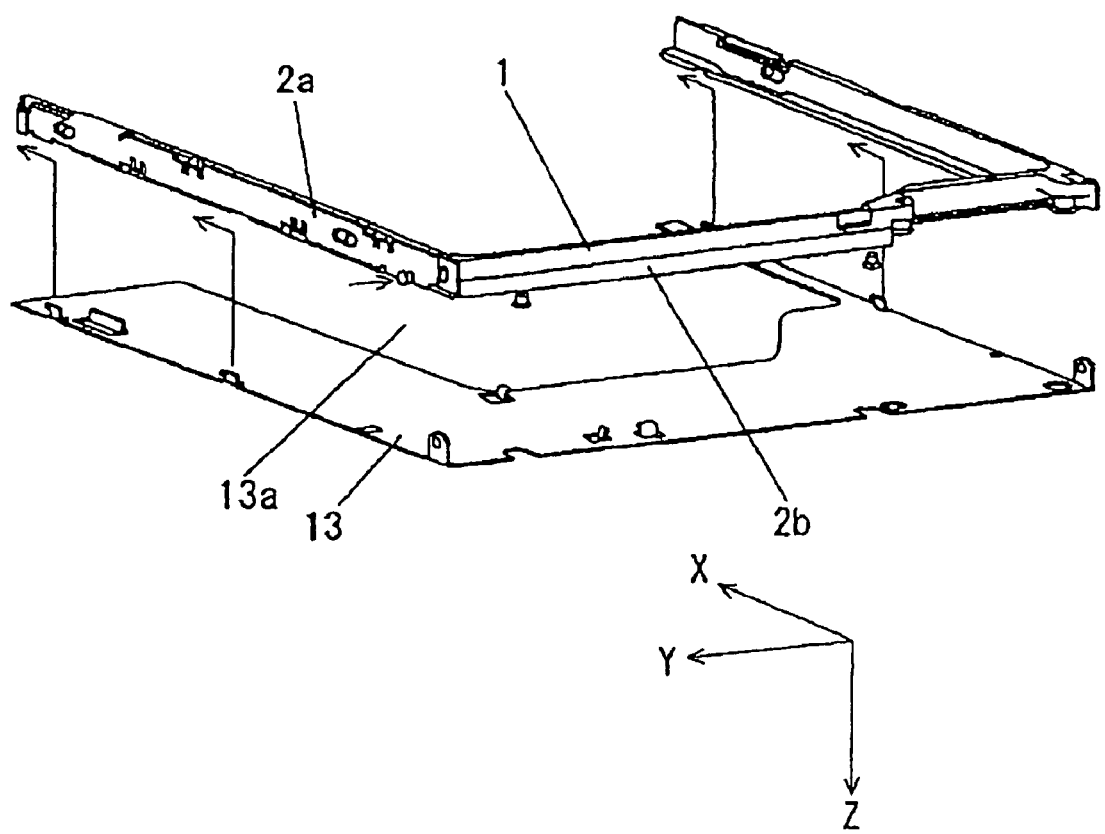
FIG. 11 is a view showing a method of assembling the frame and the bottom plate which form the body of the first embodiment.
Figure 12:
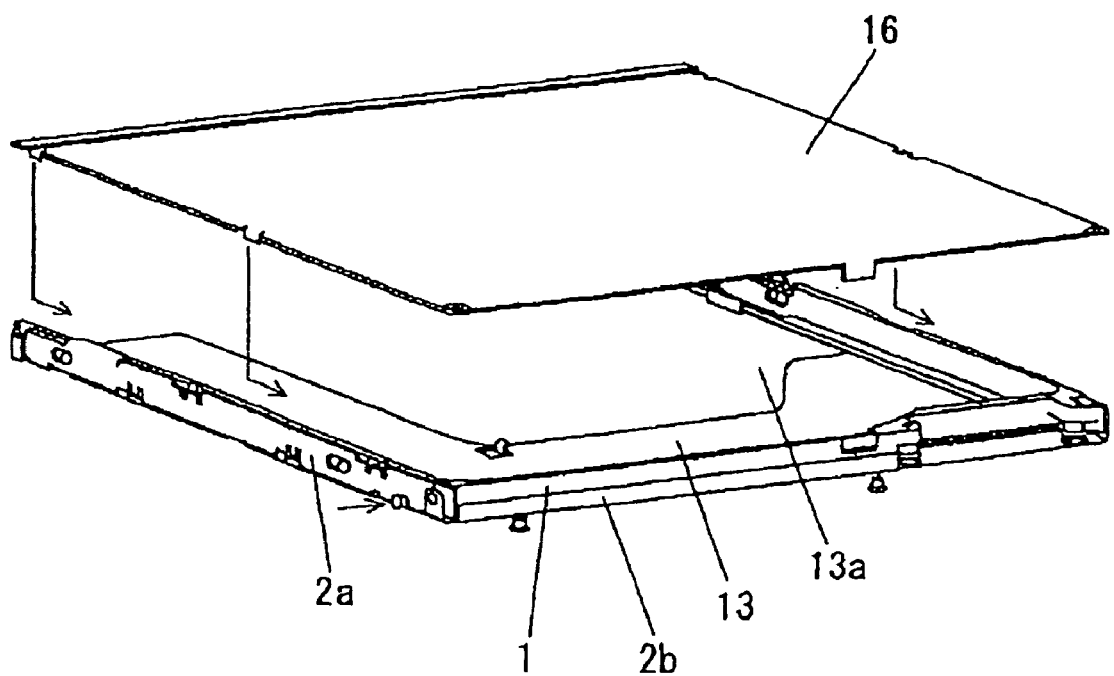
FIG. 12 is a view showing a method of assembling the frame and a top plate which form the body of the first embodiment.
Figure 12:
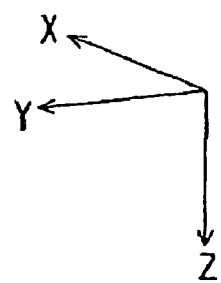
Figure 13:
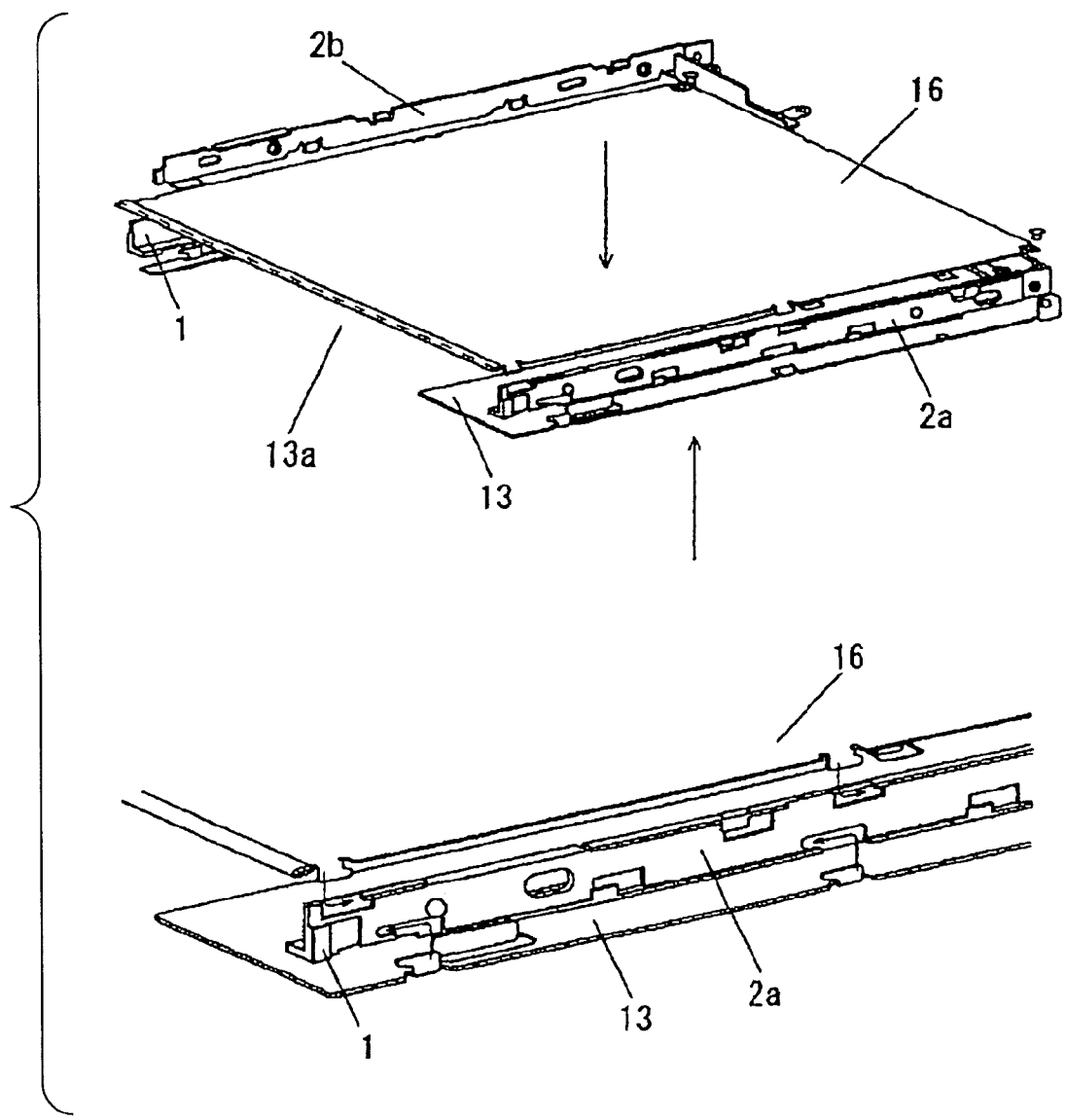
FIG. 13 is a view showing the disk unit of the first embodiment.
Figure 13:
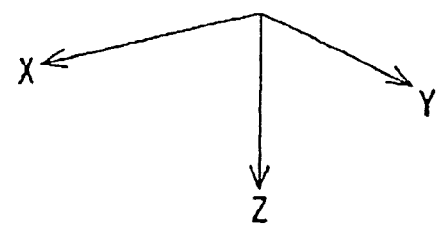

FIG. 11 is a view explanatory of a method of mounting the bottom plate 13 on the frame 1 and the reinforcing plate 2a. FIG. 12 is a view explanatory of a method of mounting the top plate 16 on the frame 1 and the reinforcing plate 2a. FIG. 13 is a view showing the mounting of the bottom plate 13 and top plate 16 on the frame 1 and the reinforcing plate 2a, with the reinforcing plate 2a removed.

The frame 1 has slits disposed in contiguous relation to the reinforcing plate 2a, and hook portions of the bottom plate 13 are inserted into the slits. The bottom plate 13 is closely contacted with the frame 1, and is slid in the direction X, so that the hook portions are engaged with the frame 1. The rear portion of the bottom plate 13 is fixed, together with the reinforcing plate 2, to the frame 1 by screws. Those portions of the frame 1 and reinforcing plate 2b opposite to the thus illustrated portions have a similar construction.

Slits are formed in the upper portion of the frame 1 in contiguous relation to the reinforcing plate 2a as described above for the bottom plate 13, and hook portions of the top plate 16 are inserted into the slits. The top plate 16 is closely contacted with the frame 1, and is slid in the direction −X, so that the hook portions are engaged with the frame 1. The rear portion of the top plate 16 is fixed to the frame 1 by screws. Those portions of the frame 1 and reinforcing plate 2b opposite to the thus illustrated portions have a similar construction.

As described above, the reinforcing plates 2a and 2b, the bottom plate 13, the top plate 16, etc., are combined with the frame 1 (i.e. the member made of a resin or the like), that is, the metal plates are combined with the frame in the direction of the height (the direction Z) and the plane direction (the direction X and the direction Y), thereby forming the body of the optical disk unit. Therefore, the body can withstand external loads applied both in the direction of the height and the plane direction. And besides, the body of the optical disk unit comprises the structural member of a closed box-shape, and therefore the strength of the body can be further increased, and there can be provided the optical disk unit which includes the body having the required strength despite the fact that the optical disk unit has the thin design.

In this embodiment, the body of the optical disk unit is broadly formed by the frame 1, the bottom plate 13 and the top plate 16. However, if a bag-like box body can be formed, the box body can be formed, for example, by two members (that is, a top portion and a bottom portion) as described in JP-A-2005-129202 Publication. In this case, by providing a member (made of a resin or the like) with good sliding properties between the rail and the bottom portion, the tray 5 can be smoothly withdrawn and inserted relative to the box body.

Second Embodiment

A second embodiment of an optical disk unit of the invention will be described below with reference to the drawings.

Figure 14:
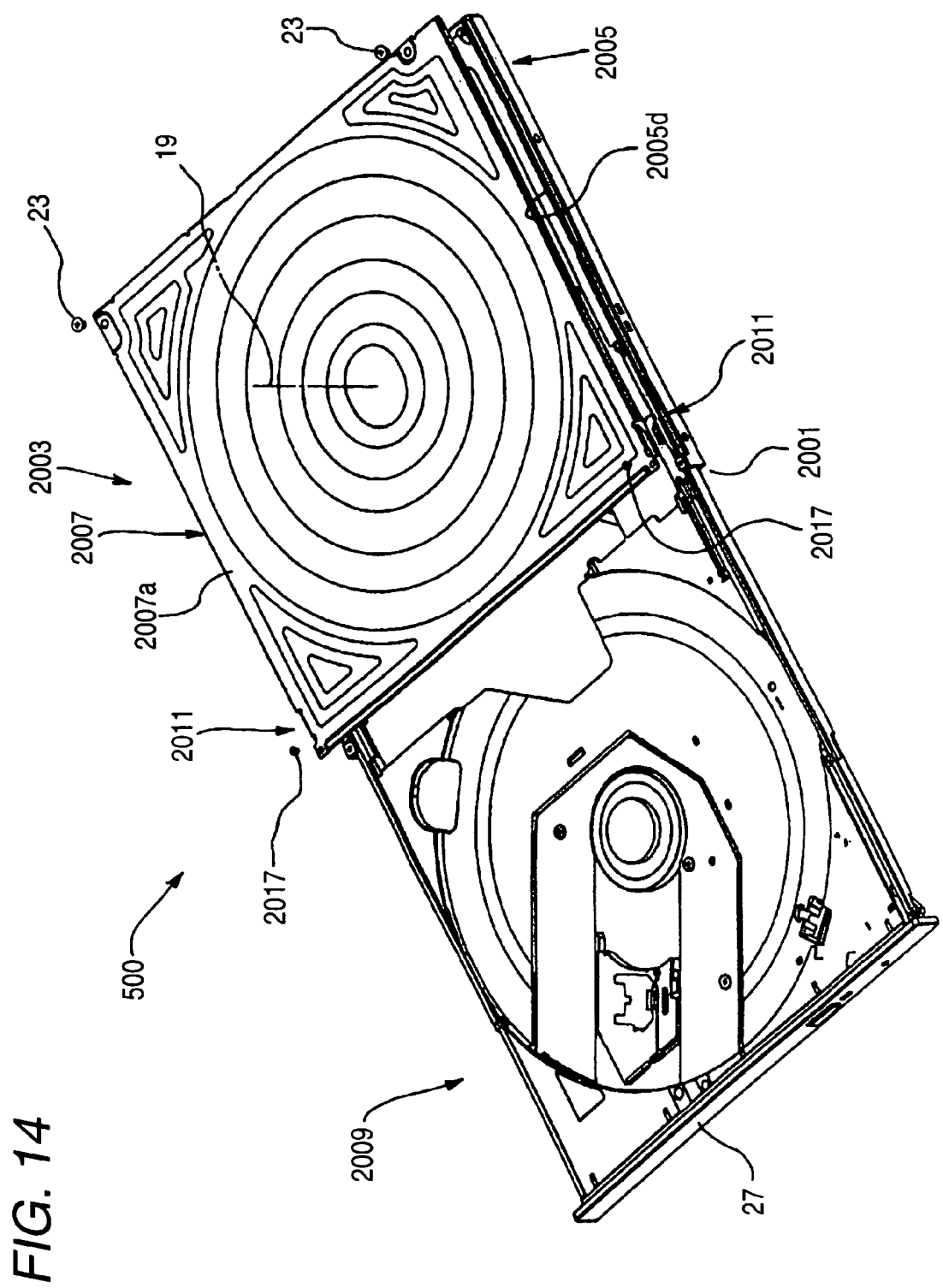
FIG. 14 is a perspective view showing a second embodiment of an optical disk unit of the invention.
Figure 15:
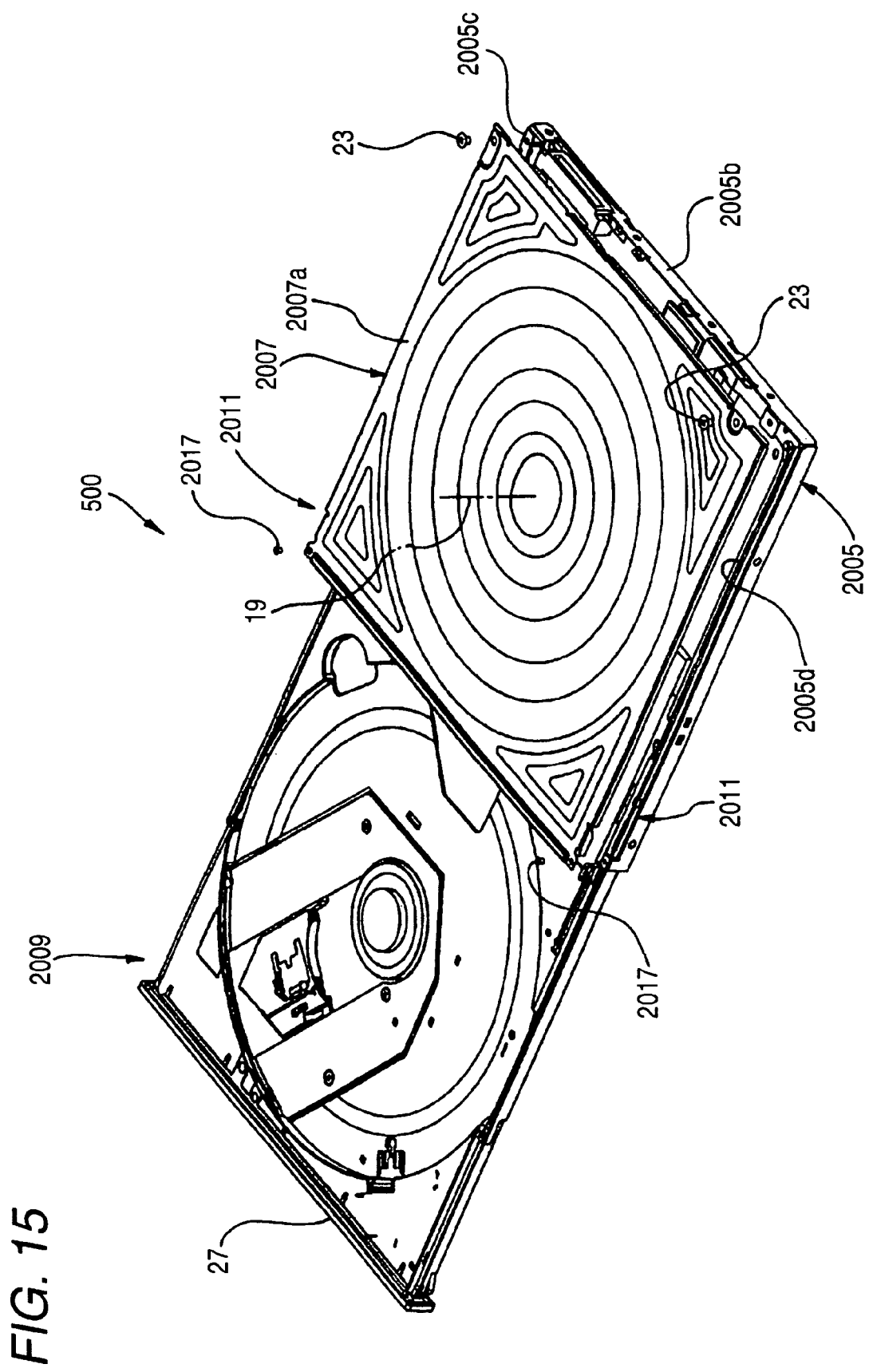
FIG. 15 is a perspective view of the optical disk unit of FIG. 14 as seen from the rear side.

FIG. 14 is a perspective view showing the first embodiment of the optical disk unit of the invention, and FIG. 15 is a perspective view of the optical disk unit of FIG. 14 as seen from the rear side.

The optical disk unit 500 includes a body 2003 of a flattened shape (thin box-like shape) having an opening 2001 formed in an end surface thereof. The body 2003 comprises a lower case 2005 and an upper case 2007 which are stacked together. A tray 2009 on which an optical disk can be placed is provided in the body 2003, and the tray 2009 can be inserted and withdrawn relative to the body 2003 through the opening 2001 formed in the end surface of the body 2003. The optical disk is not placed directly on the tray 2009, but is placed on a turntable mounted on a rotation shaft of a spindle motor 95 (described later), and will not contact the tray 2009.

The lower case 2005 includes a bottom portion 2005a having a generally L-shape in plane, a rear wall portion 2005b, and a pair of side wall portions 2005c and 2005d. The upper case 2007 comprises a top plate 2007*a* having a generally rectangular shape in plane, and is disposed on the rear wall portion 2005*b* and the side wall portions 2005*c* and 2005*d*. The lower case 2005 forms a lid member, and the opening 2001 is formed in one end surface thereof. The bottom portion 2005*a* of the lower case 2005 is formed into the generally L-shape as a result of forming a notch 2006 of a relative large area therein which corresponds in plane contour to a pickup module 57 (see FIG. 17) described later. The bottom portion 2005*a* has such an L-shape that the tray 2009 can be disposed as close as possible to the bottom portion 2005*a* of the lower case 2005.

Figure 16:
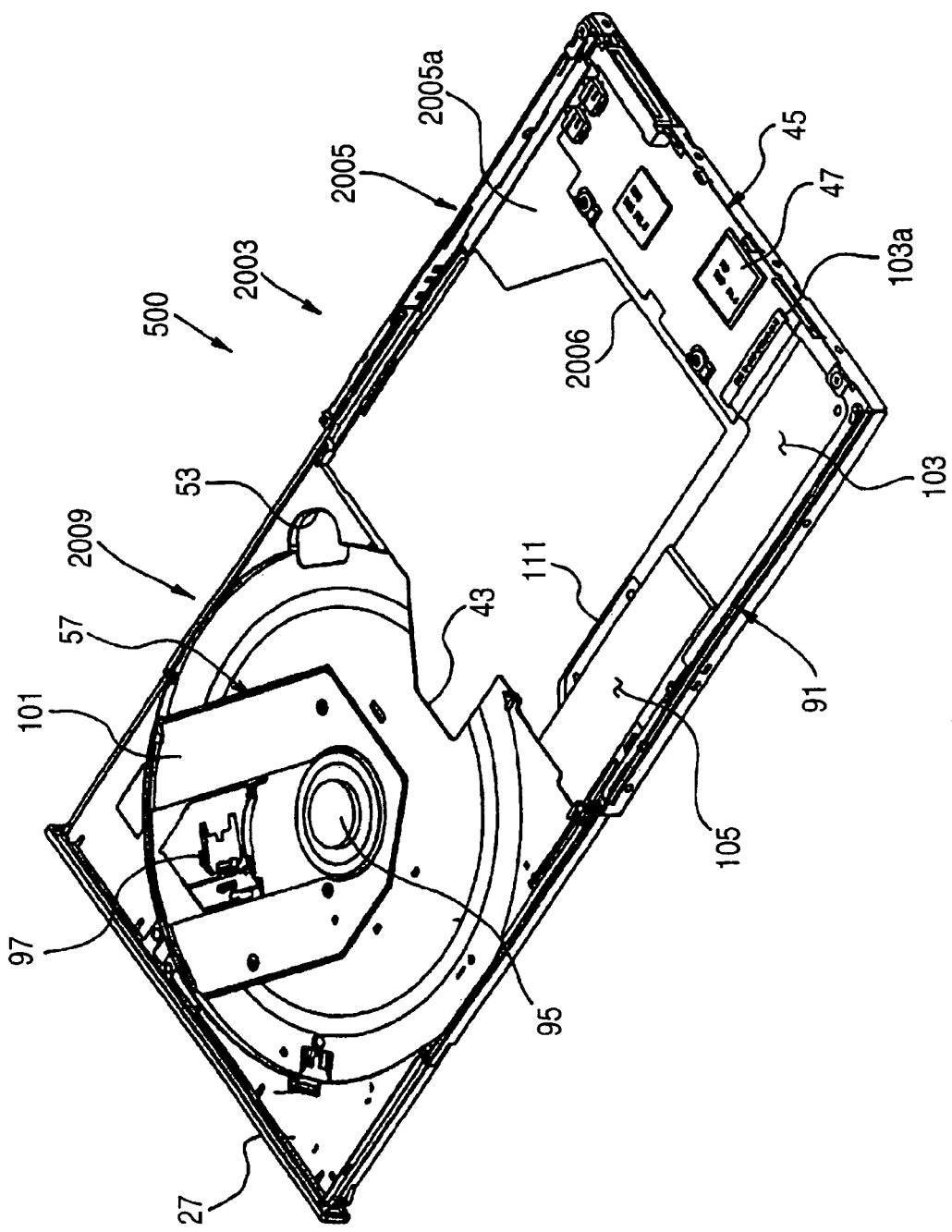
FIG. 16 is a perspective view of a lower case in an advanced condition of a tray.
Figure 17:
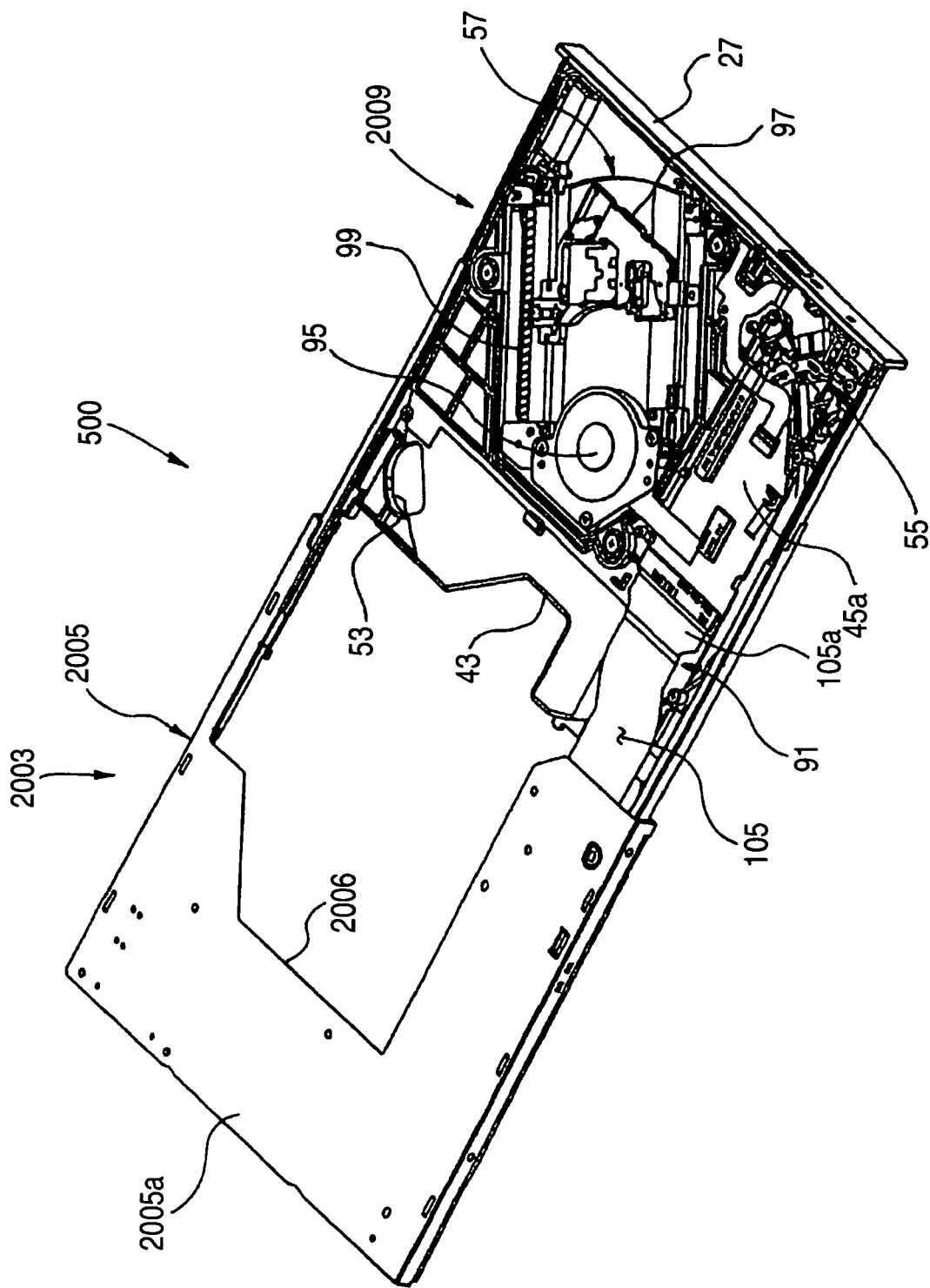
FIG. 17 is a perspective view of the tray as seen from the lower side thereof, with a tray cover removed.
Figure 18:
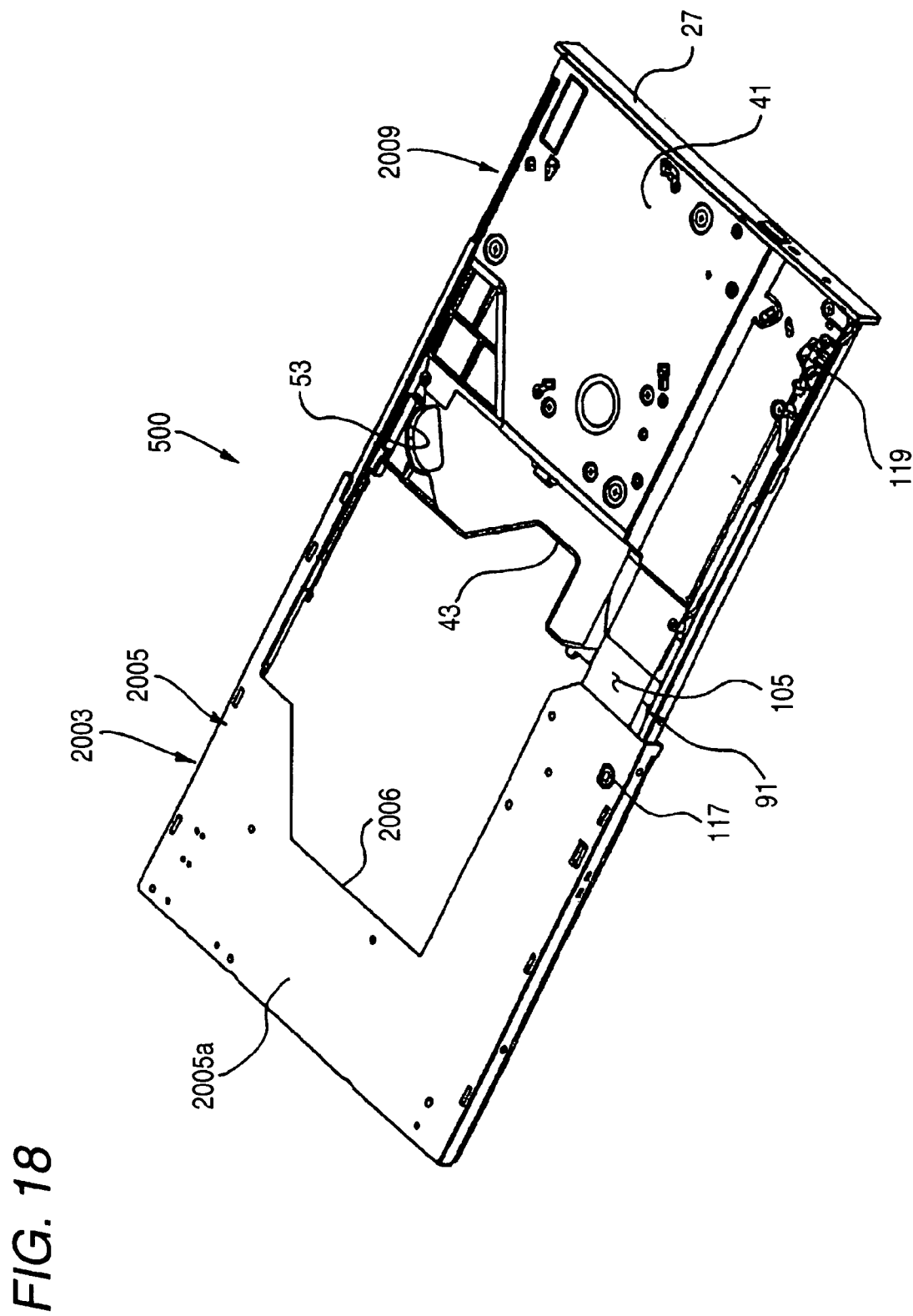
FIG. 18 is a perspective view of the tray cover as seen from the lower side.
Figure 19:
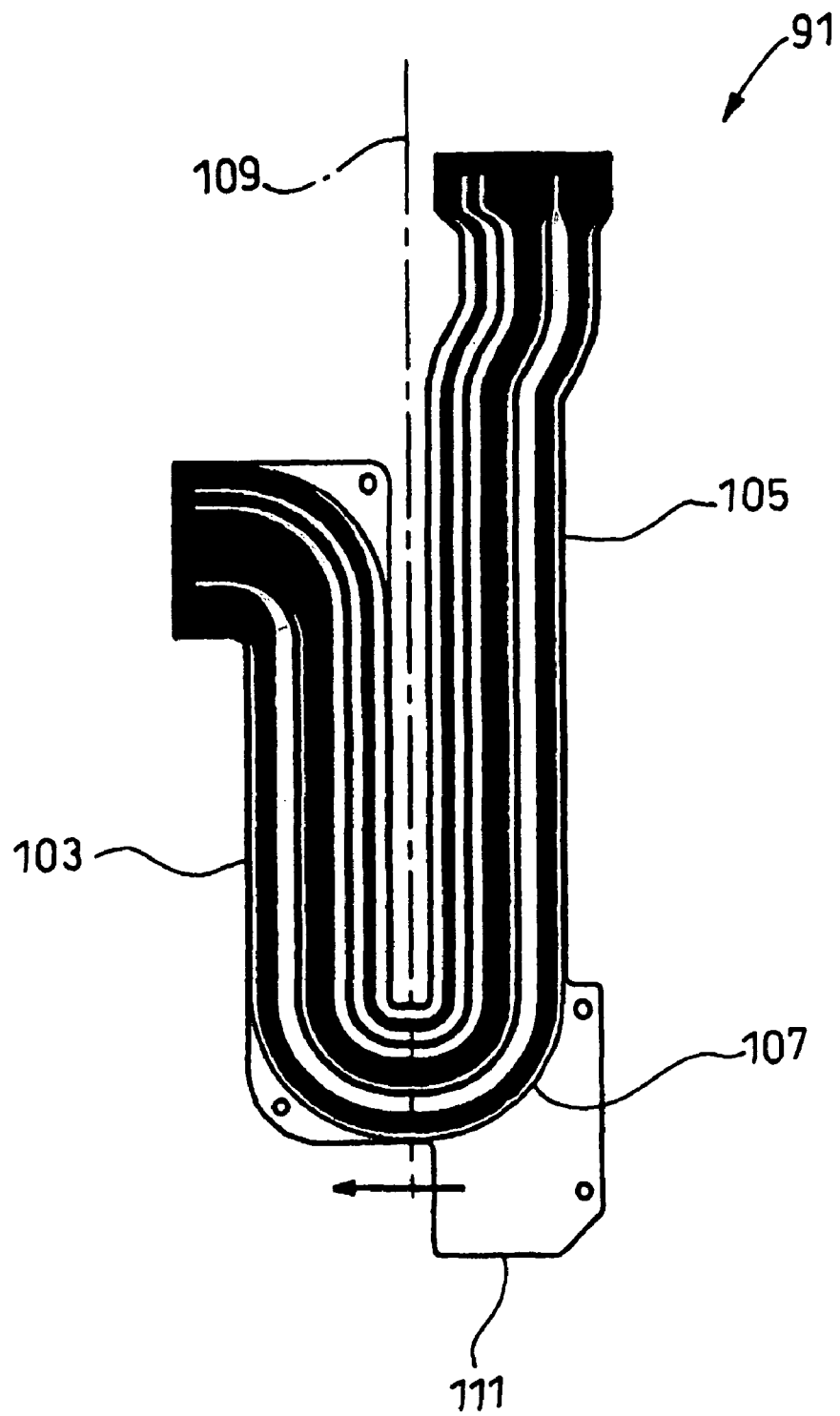
FIG. 19 is a plan view of a flexible board not yet folded.
Figure 20:
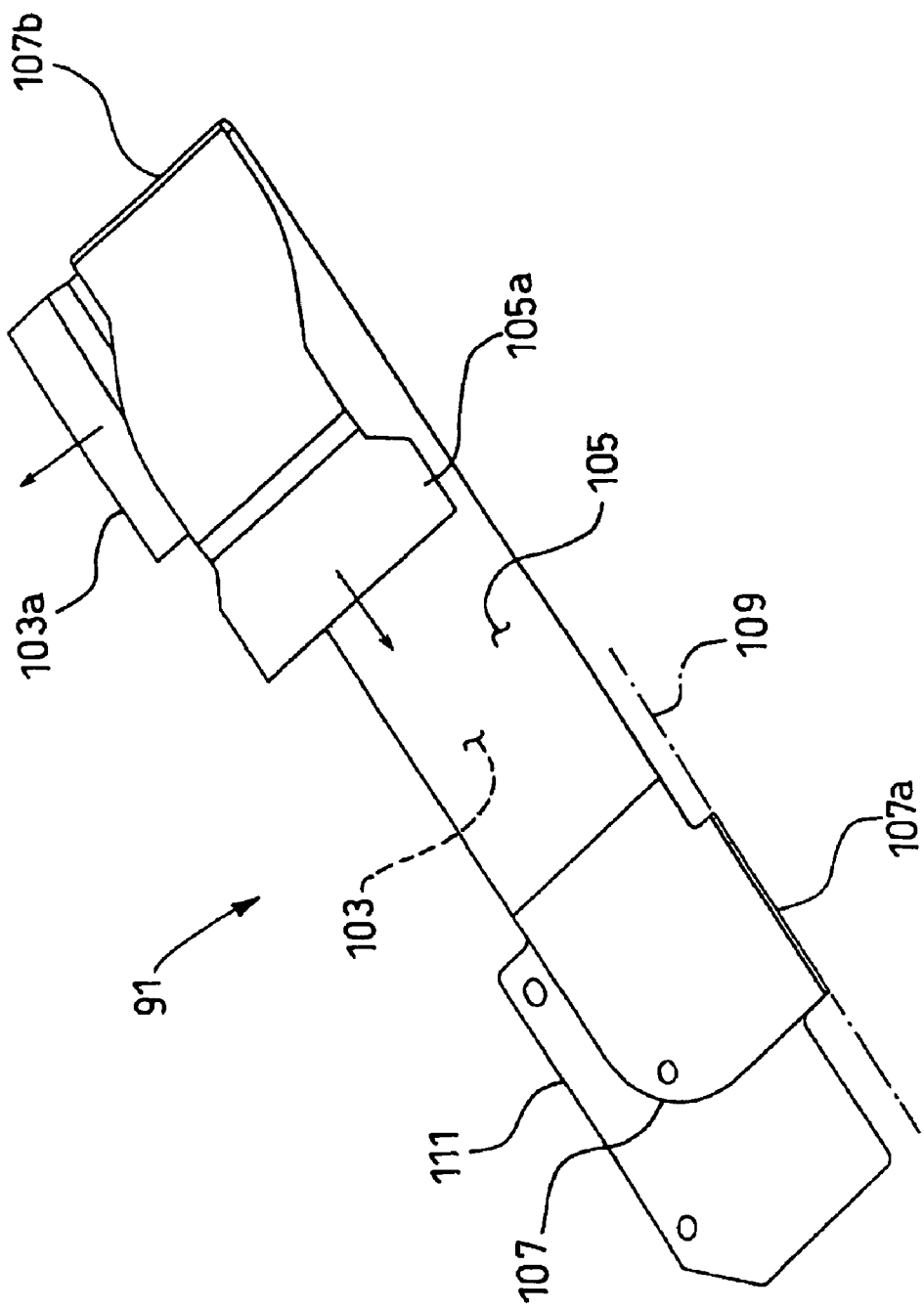
FIG. 20 is a perspective view of the flexible board in its mounted condition in a closed condition of the tray.
Figure 21:
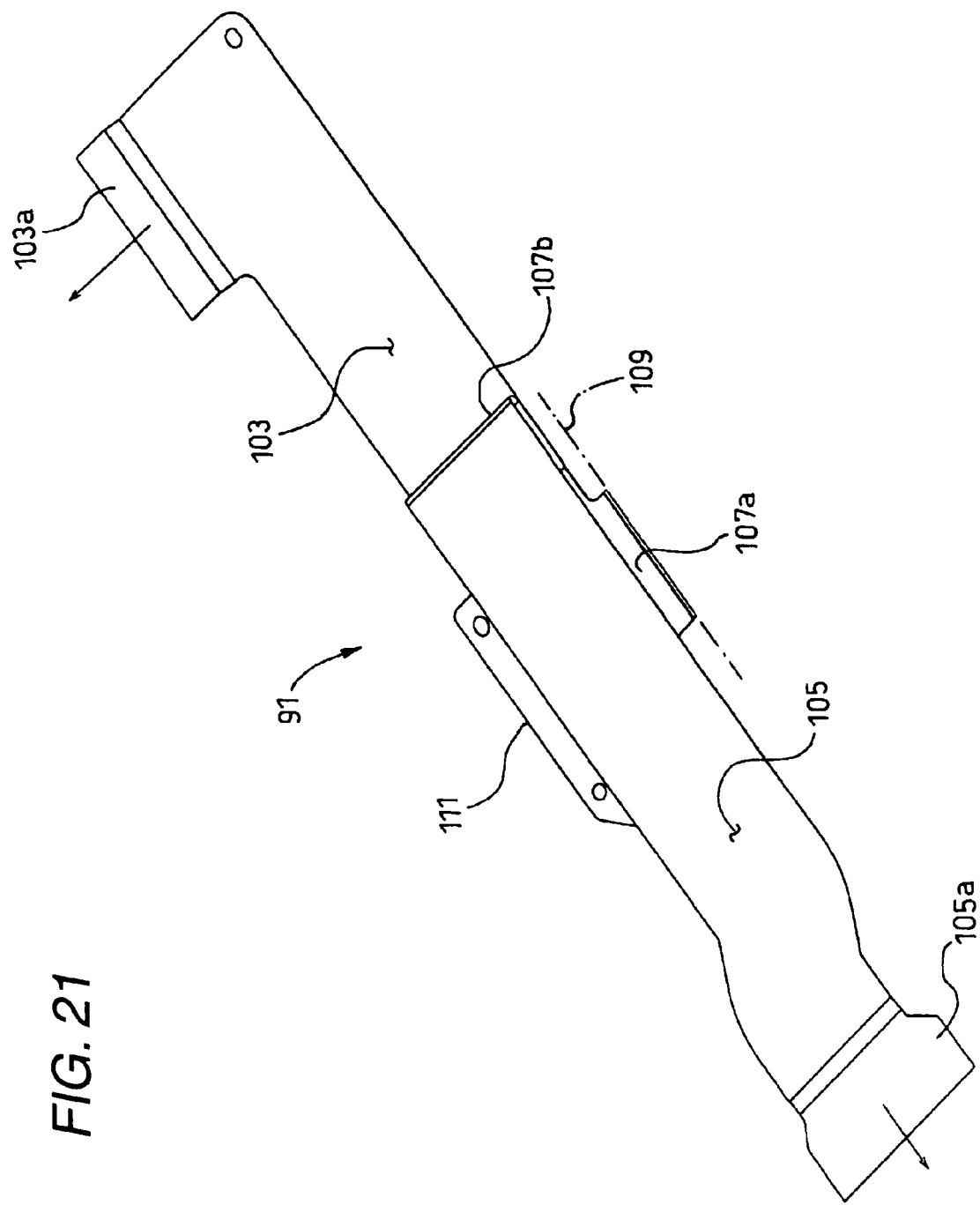
FIG. 21 is a perspective view of the flexible board in its mounted condition in an open condition of the tray.
Figure 22:
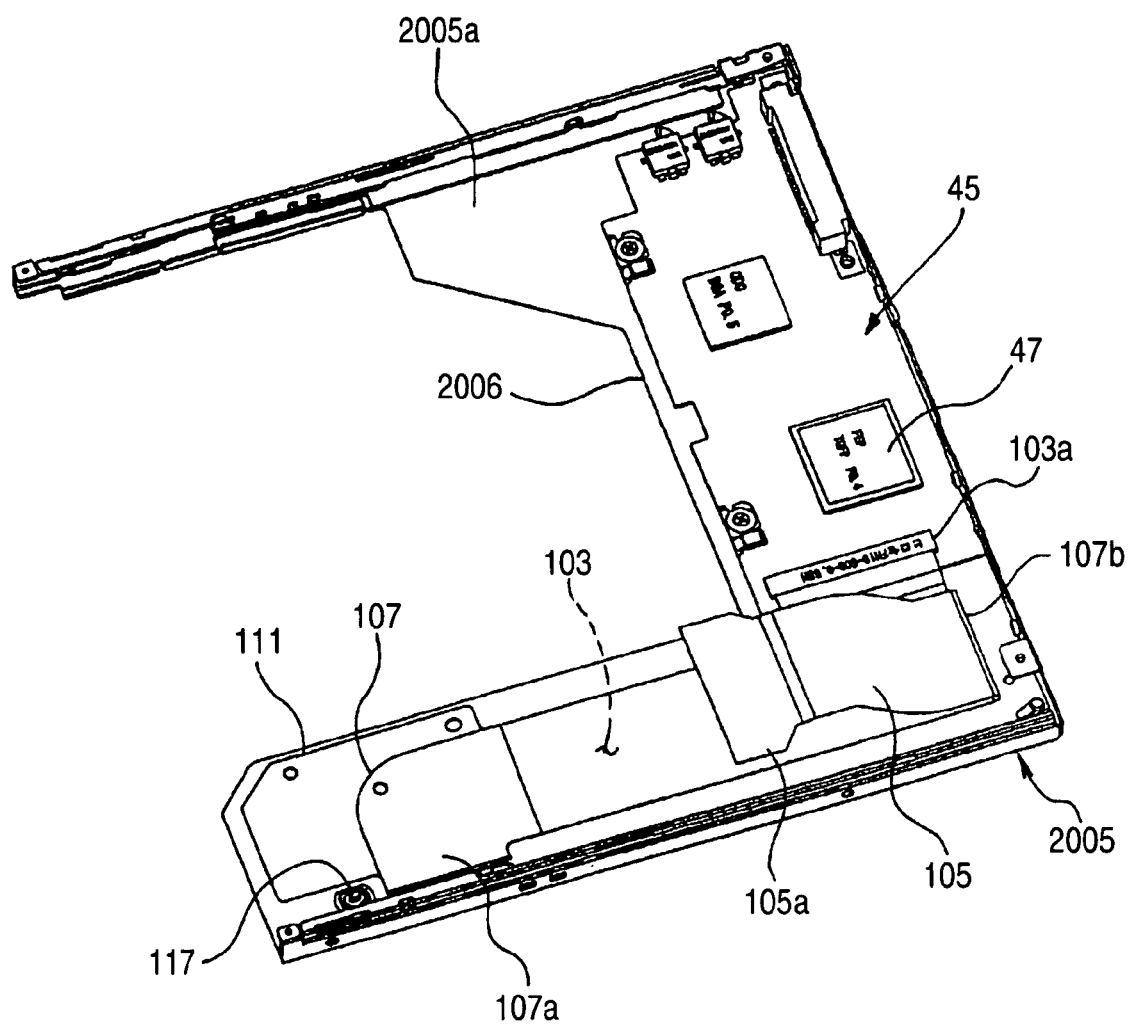
FIG. 22 is a perspective view showing the flexible board in its mounted condition in the closed condition of the tray.
Figure 23:
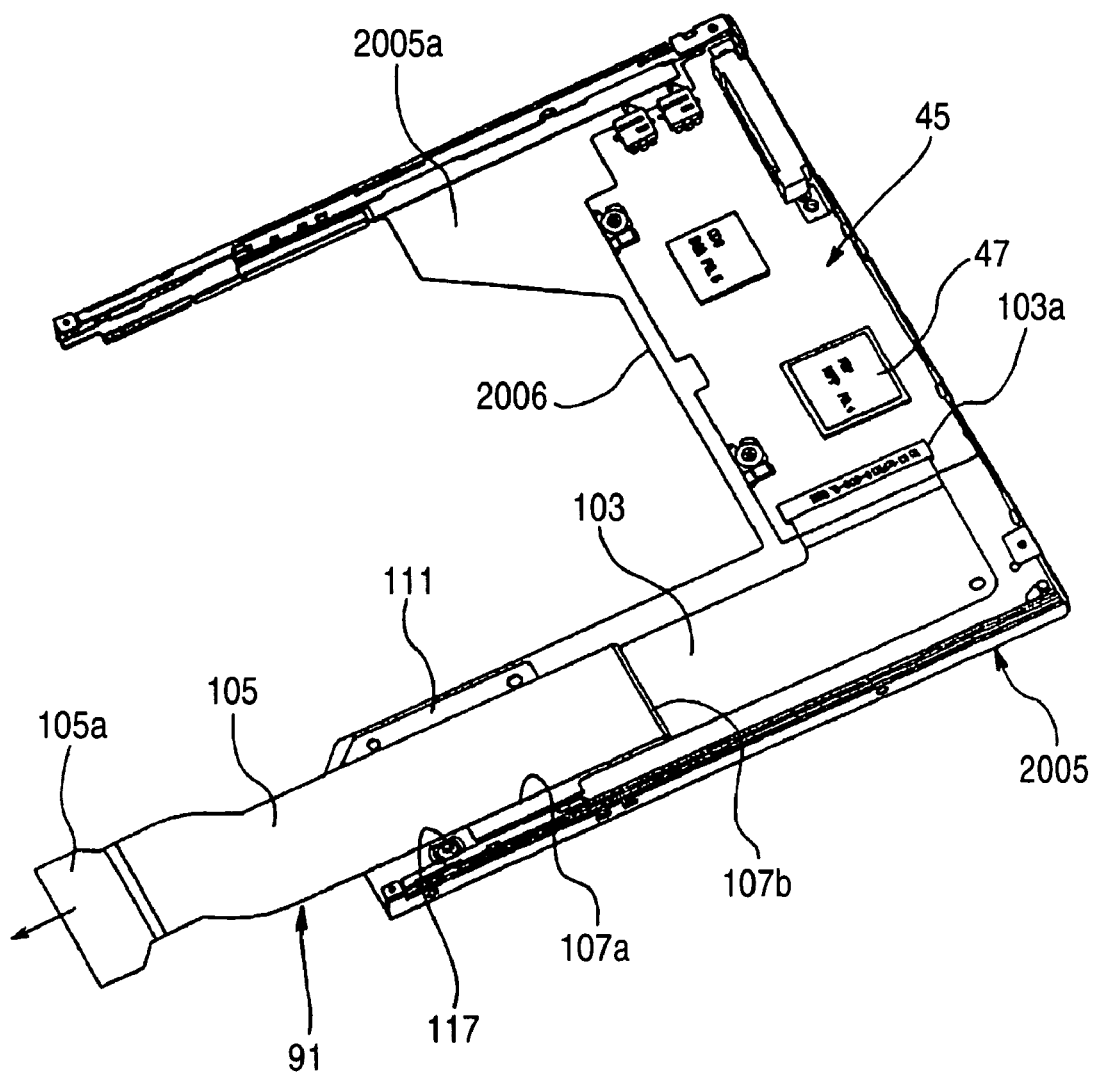
FIG. 23 is a perspective view showing the flexible board in its mounted condition in the open condition of the tray.
Figure 24:
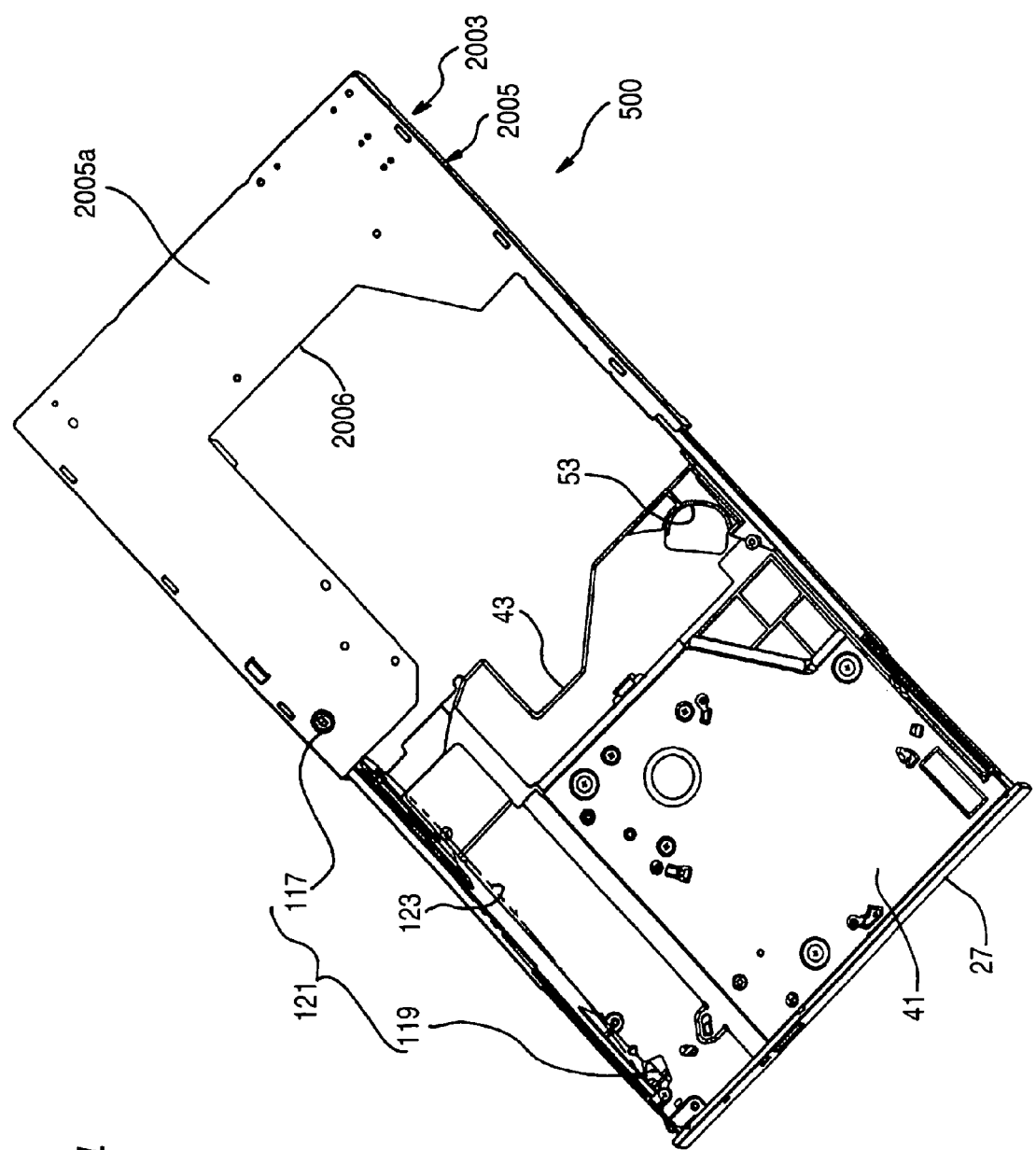
FIG. 24 is a perspective view of the tray, showing a lock shaft avoiding portion.
Figure 25A:
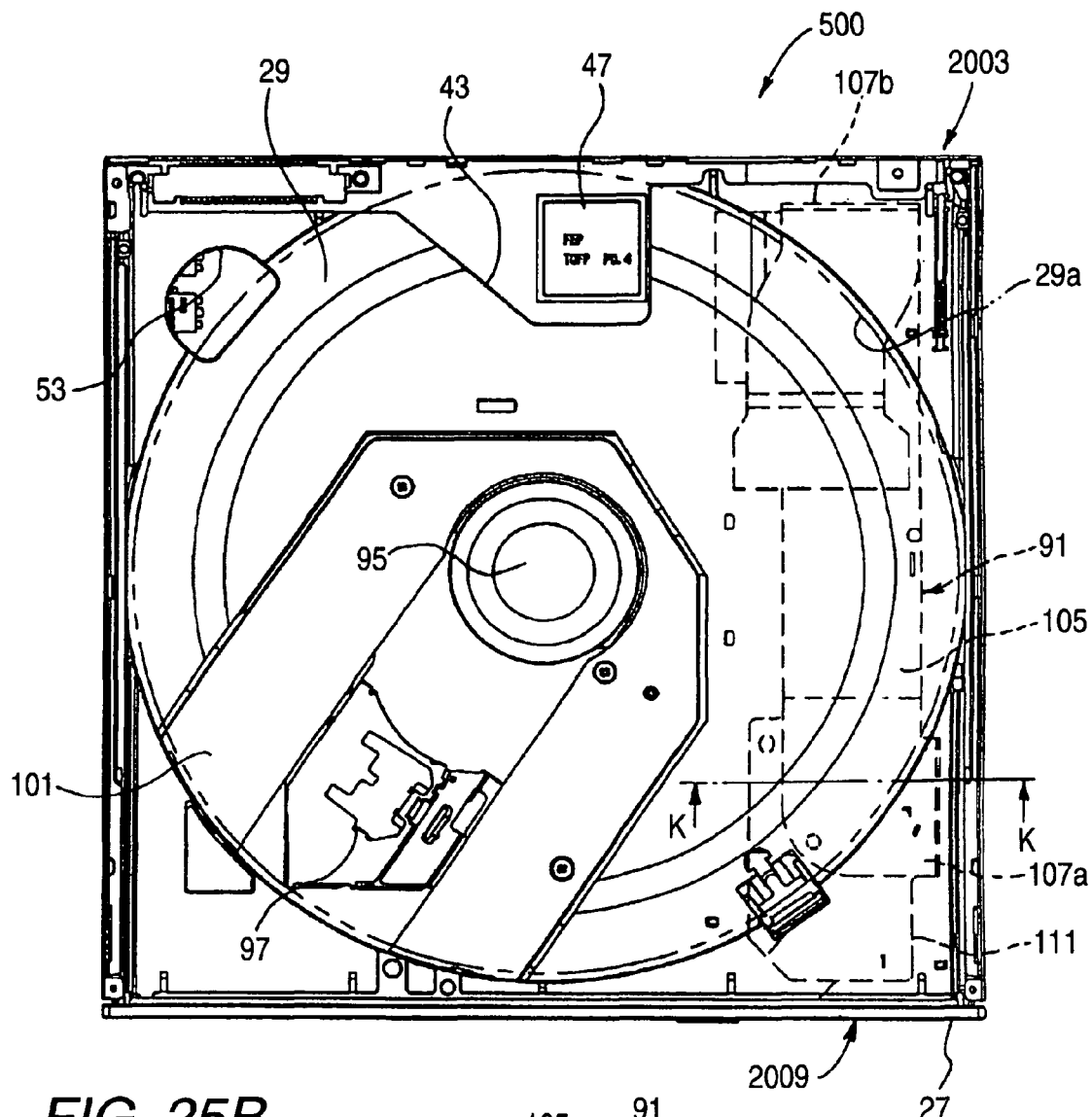
FIG. 25A is a plan view showing the flexible board in a received condition of the tray.
Figure 25B:
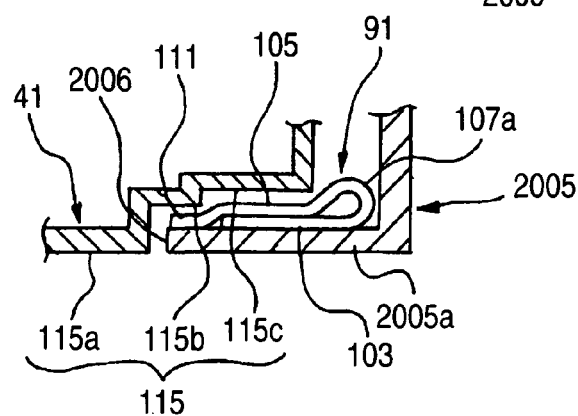
FIG. 25B is a cross-sectional view taken along the line K-K of FIG. 25A.
Figure 26:
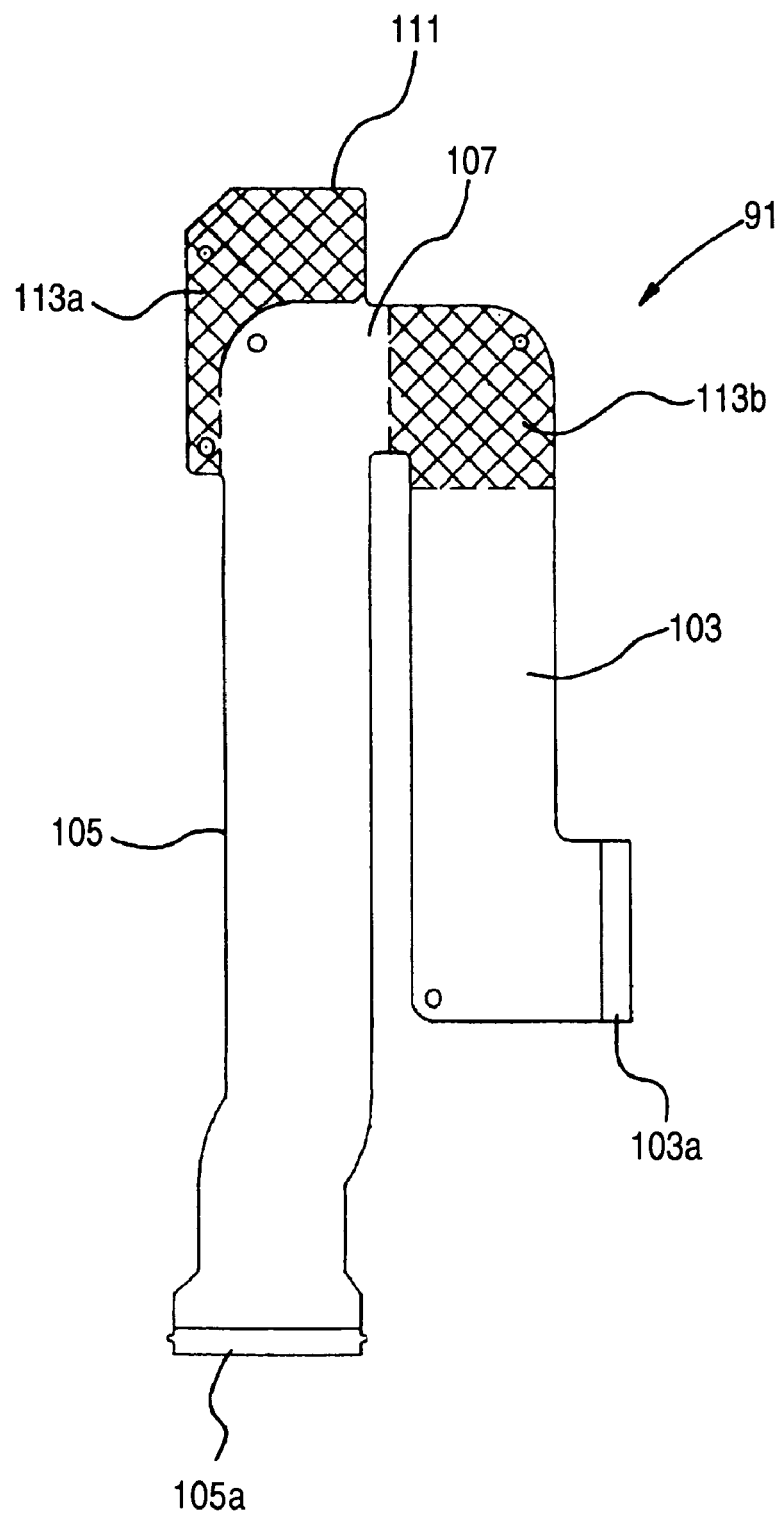
FIG. 26 is a plan view showing an adhesive double coated tape-bonding region of the flexible board.

FIG. 16 is a perspective view showing the lower case in an advanced condition of the tray, FIG. 17 is a perspective view of the tray with a tray cover removed, as seen from the lower side, FIG. 18 is a perspective view of the tray cover as seen from the lower side, FIG. 19 is a plan view of a flexible board not yet folded, FIG. 20 is a perspective view of the flexible board in its mounted condition in a closed condition of the tray, FIG. 21 is a perspective view of the flexible board in its mounted condition in an open condition of the tray, FIG. 22 is a perspective view showing the flexible board in its mounted condition in the closed condition of the tray, FIG. 23 is a perspective view showing the flexible board in its mounted condition in the open condition of the tray, FIG. 24 is a perspective view of the tray, showing a lock shaft avoiding portion, FIG. 25A is a plan view showing the flexible board in a received condition of the tray, FIG. 25B is a cross-sectional view taken along the line K-K of FIG. 25A, and FIG. 26 is a plan view showing an adhesive double coated tape-bonding region of the flexible board.

As shown in FIG. 16, a main board 45, having electronic parts 47, etc., mounted thereon, is mounted on the bottom portion 2005*a* of the lower case 2005, and the main board 45 is connected via the flexible board 91 to a relay board 45*a* (see FIG. 17) mounted on the tray 2009. The pickup module 57, an ejection mechanism 55, the spindle motor, etc., are electrically connected to the relay board 45*a*.

As shown in FIG. 17, the relay board 45*a*, the pickup module 57 and the ejection mechanism 55 are mounted on the lower surface of the tray 2009, and are covered by the tray cover 41 shown in FIG. 18. The tray cover 41 serves to protect the relay board 45*a*, the pickup module 57, the ejection mechanism 55 and other parts which are provided within the tray 2009. That portion of the tray cover 41 opposed to the flexible board 91 is stepped, that is, formed into a three-step construction in order to secure a space necessary for achieving a thin design as will more fully be described later.

A carriage 97 for rotating the optical disk 29 is movably held in the pickup module 57. Reference numeral 99 denotes a driving device for producing a driving force to move the carriage 97, and the carriage is moved by a feed motor. A light source, various optical parts, a lens, etc., are mounted on the carriage 97, and an optical device for effecting at least one of the recording and reproduction of information relative to the optical disk is mounted on the carriage. A pickup cover 101 is provided to cover that portion of the pickup module 57 opposed to the optical disk 29.

As shown in FIG. 19, the flexible board 91 is formed into a generally U-shape, and includes a pair of straight portions 103 and 105, and an interconnecting portion 107 of a generally semi-circular (half circle) arc-shape interconnecting the straight portions 103 and 105, the interconnecting portion 107 being symmetrical with respect to an axis (centerline) thereof. When mounting the flexible board 91 in the body 2003, the interconnecting portion 107 is folded on itself at and along a symmetry line 109 (serving as the boundary) into a generally quarter circle arc-shape to have a bent portion 107*a*, so that the straight portions 103 and 105 are superposed (or stacked) together as shown in FIGS. 20 and 21.

An adhesive layer may be formed on one or both of the two straight portions 103 and 105. By doing so, the superposed condition of the straight portions 103 and 105 can be positively maintained.

Thus, the flexible board 91 is folded along the symmetry line 109 (serving as the boundary), and therefore the straight portions 103 and 105 are superposed together in such a manner that each of signal wires in the flexible board 91 is generally superposed on itself. A connecting portion 103*a* of the lower straight portion 103 is connected to the main board 45, and a connecting portion 105*a* of the upper straight portion 105 (which is folded back at a bent portion 107*b* toward the interconnecting portion 107) is connected to the relay board 45*a*, and then is connected to the pickup module 57.

In this flexible board 91, the lower straight portion 103 is adhesively bonded to the lower case 2005 by an adhesive double coated tape or the like. In the flexible board 91, a flange portion 111 is formed at the interconnecting portion 107 at one side of the symmetry line 109 in corresponding relation to the upper straight portion 105 which slidingly contacts the tray 2009, and this flange portion 111 is adhesively bonded to the lower case 2005 as shown in FIG. 22. The flange portion 111 is adhesively bonded to the lower case 2005 by an adhesive double coated tape (adhesive member) 113*a* shown in FIG. 26. The two superposed portions or halves of the interconnecting portion 107 can also be bonded together by a similar adhesive double coated tape 113*b*. In this second embodiment, the flange portion 111 is the fixing portion which fixes the flexible board 91 to the body, and the flexible board 91 is the wiring board.

In this cable connecting structure, even when the connecting portion 105*a* of the upper straight portion 105 moves from a position of FIG. 22 to pass over the interconnecting portion 107 in accordance with the forward movement of the tray 2009 as shown in FIG. 23, the bent portion 107*a* of the interconnecting portion 107 will not overlap the lower layer of the upper straight portion 105 (that is, the folding line 109 of the interconnecting portion 107 will not overlap the upper straight portion 105, but is disposed laterally outwardly of the upper straight portion 105 as shown in FIG. 23), and the flexible board 91 can be longitudinally expanded and contracted while maintaining the thin superposing construction.

In this structure of fixing the flexible board 91, the flange portion 111, formed at the half portion of the interconnecting portion 107 (folded back on itself along the symmetry line 109 serving as the boundary) which is continuous with the upper straight portion 105, is adhesively bonded to the lower case 2005, and therefore the folded-back portion which tends to bulge because of a resilient restoring force resulting from the folding-back thereof, is restrained by the half portion of the interconnecting portion 107 (continuous with the upper straight portion 105) fixed to the lower case 2005 through the flange portion 111, so that the bulging of the folded-back portion is prevented. Therefore, the strength of mounting of the flexible board 91 is increased, and also the body 2003 is formed into the thin design.

And besides, any copper foil (circuit pattern) is not formed on the flange portion 111, and therefore the flange portion 111 is smaller in thickness than the straight portions 103 and 105, and is bonded to the lower case 2005 at a region thinner than the end surface of the interconnecting portion 107. Therefore, even when the tray cover 41 and the flexible board 91 contact each other in accordance with the insertion and withdrawal of the tray 2009 relative to the body 2003, the risk of separation of the flexible board 91 from the lower case 2005 can be reduced.

A stepped portion 115 is formed at the lower surface of the tray cover 41 opposed to the lower case 2005, and more specifically is formed at the lower surface of the tray cover 41 over a range corresponding to the flexible board 91, and is stepped away from the lower case 2005 in a stair-like manner as shown in FIG. 25B. Thus, the tray cover 41 provided at the reverse side of the tray is formed into the stair-like configuration, and therefore the body 2003 can be formed into the thin design without adversely affecting the followability of the flexible board 91 which follows the tray 2009 when the tray 2009 moves forward and rearward. Namely, the notch 2006 which enables the minimum thickness design is formed in the bottom portion 2005a of the lower case 2005. The flexible board 91 is bonded to that portion of the lower case bottom portion 2005a disposed in the vicinity of the notch 2006, and therefore there are provided three kinds of structure portions below the tray cover 41 as shown in FIG. 25B, that is to say, a three-layer structure portion formed by the straight portions 103 and 105 and the bottom portion 2005a, a two-layer structure formed by the flange portion 111 and the bottom portion 2005a, and an open portion formed by the notch 2006.

Step portions 115a, 115b and 115 of the stepped portion 115 corresponding respectively to the three structure portions are formed at the tray cover 41 in a stair-like manner, and with this construction the body 2003 is formed into the thin design while securing the flexible board receiving structure (in which the flexible board 91 can follow the tray 2009 moving forward and rearward) such that the maximum space can be obtained below the tray 2009.

As shown in FIG. 22, the bent portion 107a of the flexible board 91 is disposed immediately rearwardly of an engagement pin 117 in the inserting/withdrawing direction, and with this arrangement a maximum length of the flexible board 91 is secured. As shown in FIG. 24, a notch portion 123 is formed in the tray 2009, and thanks to the provision of this notch portion 123, the tray 2009, when moving forward and rearward, is prevented from interference with the engagement pin 117, and also is prevented from interference with the bent portion 107a.

There is provided reception maintaining device 121 for maintaining a received condition of the tray 2009, and this reception maintaining device 121 includes the engagement pin 117 (shown in FIG. 24) formed at the body 2003, and an engagement hook 119 which is formed at the tray 2009 and is engageable with the engagement pin 117. The bent portion 107a is disposed rearwardly of the engagement pin 117 in the direction of inserting and withdrawing of the tray 2009. With this positional relation between the bent portion 107a and the engagement pin 117, the bent portion 107a and the engagement pin 117 are prevented from interfering with each other in the stacking direction. Therefore, the thin design of the body 2003 can be achieved.

When the tray 2009 is received in the body 2003, the bent portion 107b at which the straight portion 105 is folded back toward the interconnecting portion 107 is disposed outwardly of an outer peripheral edge 29a of the optical disk 29 placed on the tray 2009. As the tray 2009 is drawn out from the body 2003, the bent portion 107b, while gradually shifting its bending position toward the outside, follows the tray 2009. Namely, the lower layer portion of the straight portion 105 once forms the bent portion 107b generally over the entire range, and then is formed into the upper layer portion of the straight portion 105. Therefore, the maximum radius of bending of the bent portion 107b can be made large, and therefore the risk of cutting of the wires in the straight portion 105 is reduced, and besides the bent portion 107b of a relatively large thickness can be prevented from overlapping the optical disk 29. Therefore, a gap corresponding to the thickness of the two layers, that is, the superposed two straight portions 103 and 105 except the bent portion 107b, only need to be secured between the tray 2009 and the lower case 2005, and therefore the body 2003 is formed into the thin design.

In the optical disk unit 500 of this second embodiment, the flexible board 91 of the generally U-shape, including the pair of straight portions 103 and 105 interconnected by the arc-shaped interconnecting portion 107, is folded along the symmetry line (boundary) 109 in such a manner that the straight portions 103 and 105 are superposed or stacked. The connecting portion 103a of the lower straight portion 103 is connected to the main board 45, and the connecting portion 105a of the upper straight portion 105 folded back toward the interconnecting portion 107 is connected to the relay board. In this structure, even when the connecting portion 105a of the upper straight portion 105 moves over the interconnecting portion 107 in accordance with the forward and rearward movement of the tray 2009, the bent portion 107a of the interconnecting portion 107 will not overlap the lower layer of the upper straight portion 105. As a result, the flexible board 91 can be longitudinally expanded and contracted with the thin superposing construction, and the body 2003 can be formed into the thin design.

As described above, the wiring board, electrically connecting the two boards together, has the two bent portions such that the wiring board is superposed in three layers, and the area of the 3-layer superposed portion is changed according to the amount of drawing-out of the tray. With this construction, the area of mounting of the wiring board can be made small while maintaining the operability of the tray when drawing out and inserting the tray relative to the body. In this second embodiment, the wiring board is the flexible board 91. In this second embodiment, the wiring board, electrically connecting the two boards together, has the two bent portions such that the wiring board is superposed in three layers, and the area of the 3-layer superposed portion is changed according to the amount of drawing-out of the tray. However, the number of the bent portions of the wiring board is not limited to two. When the wiring board has two or more bent portions, similar advantages as in the first embodiment can be obtained.

In the first and second embodiments, the optical disk unit for reading and/or recording information relative to the optical disk by irradiating light to the optical disk (such as a CD, a CD-ROM, a CD-R, a CD-RW, a DVD-ROM, a DVD±R, a DVD±RW, a DVD-RAM, a Blue-ray Disk and a HD DVD) has been described above as one example of disk units. However, the present invention can be applied also to the type of disk unit for recording and/or reproducing information relative to a disk-like recording medium such as a magnetic disk and a magneto-optic disk.

The present invention can be applied to the optical disk unit or the like requiring a thin design.

This application is based on and claims the benefit of priority of Japanese Patent Applications Nos. 2005-314092 filed on Oct. 28, 2005 and 2006-86084 filed on Mar. 27, 2006, the content of which is incorporated herein by references in its entirety.

What is claimed is:

1. An optical disk unit comprising:
a tray for supporting an optical disk thereon;

a body for receiving said tray therein, said tray and said body being configured to enable said tray to be moved in and out relative to said body;

a first board provided at said body;

a second board provided at said tray; and a wiring board electrically connecting said first board and said second board together, wherein:

said wiring board includes a first wiring board portion connected to said first board, a second wiring board portion connected to said second board, and a third wiring board portion connected between said first wiring board portion and said second wiring board portion, said third wiring board portion including a bent portion which is folding along a virtual line which is parallel with a direction of movement of the tray when the tray is being moved in and out relative to said body, and the virtual line is offset from the first wiring board portion and the second wiring board portion wherein the bent portion is not superposed on the first wiring board portion or the second wiring board portion when the tray is being moved in and out relative to said body.

2. An optical disk unit according to claim 1, wherein responsive to the tray being moved in and out relative to said body, an amount of superposition of a second end portion of the second wiring board portion over a first end portion of the second wiring board portion and said first wiring board portion becomes largest when an amount of drawing-out of said tray from said body becomes a half of a maximum amount of drawing-out of said tray.

3. An optical disk unit according to claim 1, wherein said wiring board is a flexible board.

4. An optical disk unit according to claim 1, wherein said wiring board includes a fixing portion fixing said wiring board to said body, and said fixing portion is disposed adjacent to a position at which a first end portion of said second wiring board portion is connected to the first wiring board portion.

5. An optical disk unit according to claim 1, further comprising a tray cover protecting parts provided in said tray, wherein said wiring board is disposed in a space formed by said body and said tray cover, and said tray cover has a stepped portion formed at a surface thereof facing said wiring board, and said stepped portion is stepped inwardly in a stair-like manner in a direction toward a location of superposition of a second end portion of said second wiring board portion over a first end portion of said second wiring board portion and said first wiring board portion.

6. An optical disk unit according to claim 1, further comprising a reception maintaining device including an engagement pin provided at said tray and an engagement hook provided at said body, wherein, when said engagement pin and said engagement hook are engaged with each other, said tray is kept received in said body;

wherein a first end portion of said second wiring board portion and a second end portion of said second wiring board portion include an interconnecting portion intermediate thereof and said interconnecting portion is disposed rearwardly of said engagement pin in the direction of inserting of said tray.

7. An optical disk unit according to claim 1, wherein a first end portion of said second wiring board portion and a second end portion of said second wiring board portion include a bent portion intermediate thereof and when an optical disk is disposed on said tray which is received in said body, said bent portion is disposed radially outwardly of an outer peripheral edge of the optical disk.

* * * * *